(12) United States Patent
Liu et al.

(10) Patent No.: US 9,915,709 B2
(45) Date of Patent: Mar. 13, 2018

(54) CONTROLLING A MOTOR WITH TWO OR MORE HALL SENSORS

(71) Applicant: Woodward, Inc., Fort Collins, CO (US)

(72) Inventors: Raymond Liu, Monterey Park, CA (US); Estella Chung, West Hills, CA (US)

(73) Assignee: Woodward, Inc., Fort Collins, CO (US)

( * ) Notice: Subject to any disclaimer, the term of this patent is extended or adjusted under 35 U.S.C. 154(b) by 0 days.

(21) Appl. No.: 14/975,145

(22) Filed: Dec. 18, 2015

(65) Prior Publication Data

US 2016/0105134 A1    Apr. 14, 2016

Related U.S. Application Data

(63) Continuation of application No. 14/085,164, filed on Nov. 20, 2013, now Pat. No. 9,239,345.

(51) Int. Cl.
| | |
|---|---|
| *H02K 29/08* | (2006.01) |
| *G01R 33/07* | (2006.01) |
| *G01R 23/00* | (2006.01) |
| *H02P 6/16* | (2016.01) |
| *H02P 6/00* | (2016.01) |

(Continued)

(52) U.S. Cl.
CPC ............ *G01R 33/07* (2013.01); *G01R 23/00* (2013.01); *H02P 6/001* (2013.01); *H02P 6/12* (2013.01); *H02P 6/16* (2013.01); *H02P 29/032* (2016.02)

(58) Field of Classification Search
USPC ............................ 318/400.38, 647, 602, 603
See application file for complete search history.

(56) References Cited

U.S. PATENT DOCUMENTS

| | | |
|---|---|---|
| 5,517,102 A | 5/1996 | Jensen |
| 5,663,616 A | 9/1997 | Stringfellow et al. |
| 6,051,943 A | 4/2000 | Rabin et al. |

(Continued)

FOREIGN PATENT DOCUMENTS

| | | |
|---|---|---|
| CN | 102075126 A | 5/2011 |
| EP | 1788461 B1 | 6/2009 |

(Continued)

OTHER PUBLICATIONS

Hui-Cong Wu, "Fault Tolerant Circuit Design using Evolutionary Algorithms," International Journal of Computer Science Issues, vol. 10, Issue 1, No. 1, Jan. 2013, pp. 230-235.

(Continued)

*Primary Examiner* — Jorge L Carrasquillo
(74) *Attorney, Agent, or Firm* — Fish & Richardson P.C.

(57) ABSTRACT

A motor system includes a motor including two Hall sensors configured to output binary values, and a controller configured to control the motor. The two Hall sensors are placed 120 or 60 electrical degrees apart. The controller is operable to monitor output signals of the two Hall sensors and to determine a third Hall sensor output binary value. The controller is operable to fulfill the commanded requirements to operate in a servo system, by controlling commutation of a drive current into the motor, and by keeping track of the motor rotor position based on the third generated signal and the outputs of the two Hall sensors.

14 Claims, 11 Drawing Sheets

(51) Int. Cl.
*H02P 6/12* (2006.01)
*H02P 29/032* (2016.01)

(56) References Cited

U.S. PATENT DOCUMENTS

| | | | |
|---|---|---|---|
| 7,049,813 | B2 | 5/2006 | Morita, Jr. et al. |
| 7,230,422 | B2 | 6/2007 | Morita, Jr. et al. |
| 7,472,000 | B2 | 12/2008 | Steiger |
| 7,808,200 | B2 | 10/2010 | Liu et al. |
| 7,816,881 | B2 | 10/2010 | Wiegers et al. |
| 7,973,503 | B2 | 7/2011 | Liu et al. |
| 8,058,826 | B2 | 11/2011 | Mock et al. |
| 2005/0031322 | A1 | 2/2005 | Boyle et al. |
| 2005/0152489 | A1* | 7/2005 | Morita, Jr. ............... H02P 6/16 377/6 |
| 2009/0066274 | A1 | 3/2009 | Liu et al. |
| 2009/0079380 | A1 | 3/2009 | Lundell |
| 2009/0322267 | A1 | 12/2009 | Mock et al. |
| 2010/0264862 | A1 | 10/2010 | Kitagawa |
| 2011/0210651 | A1 | 9/2011 | Maeda et al. |
| 2012/0001582 | A1 | 1/2012 | Park |
| 2012/0262097 | A1 | 10/2012 | Yamato et al. |
| 2013/0069635 | A1 | 3/2013 | Kitamoto |
| 2013/0154527 | A1* | 6/2013 | Suk .......................... H02P 6/17 318/400.06 |

FOREIGN PATENT DOCUMENTS

| | | |
|---|---|---|
| GB | 2462940 | 3/2010 |
| WO | WO199414226 A1 | 6/1994 |
| WO | WO2012029057 A1 | 3/2012 |

OTHER PUBLICATIONS

Pavel Sustek, "BLDC Motor Control with Hall Sensors Driven by DCS using TWR-56F8257 and TWR-MC-LV3PH Boards," Freescale Semiconductor, Document No. AN4413, Copyright 2011, 28 pages, http://cache.freescale.com/files/microcontrollers/doc/app_note/AN4413.pdf.

* cited by examiner

CONTROLLING A MOTOR WITH TWO OR MORE HALL SENSORS

CROSS-REFERENCE TO RELATED APPLICATIONS

This application is a continuation application of and claims the benefit of priority to U.S. application Ser. No. 14/085,164, filed on Nov. 20, 2013, the contents of which are hereby incorporated by reference.

BACKGROUND

This specification relates to controlling a motor with two or more Hall sensors.

Hall-effect digital output sensors can be used to detect discrete rotational position of a motor, such as a brushless DC (BLDC) motor. A BLDC motor typically requires at least three Hall sensors (also known as Hall-effect sensors) to effectively commutate the motor and provide motor position feedback. The Hall sensors can be used to control electronic switching or "commutation" of drive current among a plurality of motor windings. The commutation induces a rotating component to an overall magnetic field associated with the windings. The interaction of the rotating magnetic field component with the motor's permanent magnets can cause rotation of the motor. In one example, a BLDC configuration employs three windings offset from each other by 120 degrees of electrical phase.

SUMMARY

In some aspects, a motor system includes a motor including two Hall sensors configured to output binary values, and a controller configured to control the motor. The two Hall sensors are placed 120 electrical degrees apart. The controller is operable to monitor output signals of the two Hall sensors. When the output signals of the two Hall sensors are different binary values, the controller is operable to determine a third signal to be alternating between the binary values at a frequency no less than a maximum state transition frequency of the motor. The controller is operable to control commutation of a drive current into the motor based on the third signal and the outputs of the two Hall sensors.

In some aspects, a motor system includes a motor including two Hall sensors configured to output binary values, and a controller configured to control the motor. The two Hall sensors are placed 60 electrical degrees apart. The controller is operable to monitor output signals of the two Hall sensors. When the output signals of the two Hall sensors are different binary values, the controller is operable to determine a third signal to be a same binary value as an output signal of a pivot Hall sensor. The pivot Hall sensor is one of the two Hall sensors. The controller is operable to control commutation of a drive current into the motor based on the third signal and the output signals of the two Hall sensors.

In some aspects, a motor with a failed Hall Effect sensor can be compensated. The motor includes three Hall sensors configured to output binary values. The three Hall sensors are separated by 120 or 60 electrical degrees. In some implementations, the failed Hall sensor is identified. If the three Hall sensors are separated by 120 electrical degrees, when output signals of two Hall sensors other than the failed Hall sensor have a same binary value, a compensated output signal of the failed Hall sensor is determined to be a binary value other than the same binary value. If the three Hall sensors are separated by 60 electrical degrees, the compensated output signal of the failed sensor can be determined based on a position of the failed Hall sensor relative to the two Hall sensors other than the failed Hall sensor, and the output signals of the two Hall sensors other than the failed Hall sensor. Commutation of a drive current of the motor is controlled based on the compensated output signal of the failed Hall sensor and the output signals of the two Hall sensors other than the failed Hall sensor.

The controller is operable to fulfill the commanded requirements to operate in a servo system, by controlling commutation of a drive current into the motor, and by keeping track of the motor rotor position based on the third generated signal and the outputs of the two Hall sensors. Details of one or more implementations are set forth in the accompanying drawings and the description below. Other features, objects, and advantages will be apparent from the description and drawings, and from the claims.

DETAILED DESCRIPTION

Brushless DC motors (BLDC motors) have been used in a variety of applications including, for example, vehicles, motion control systems, positioning or actuation systems, or other application systems. A BLDC motor typically requires three or more Hall Effect sensors for effective motor commutation and motor position counting to provide position feedback. If one of the Hall sensors is damaged or has otherwise failed, the commutation of the motor can be disrupted and the position information becomes inaccurate and may even be lost, which can lead to loss of operation.

The example techniques described herein enable a BLDC motor to operate using as few as two Hall sensors. The two Hall sensors can be the only Hall sensors equipped with the motor, or the two Hall sensors can be selected or otherwise identified among three or more Hall sensors associated with the motor. For example, the motor may be a common BLDC motor equipped with three or more Hall sensors, and the two Hall sensors may be the remaining two "good" Hall sensors when one of the three Hall sensors have failed. In some instances, some aspects of the example techniques described herein can be implemented as a fault tolerant algorithm for a controller of the motor to recover from a failed motor Hall sensor. For instance, by simulating or otherwise compensating for proper operations of the failed Hall sensor, the controller would be able to continue to commutate the motor and keep track of motor position using the remaining two good Hall sensors. The vehicles, actuation systems, or other critical application systems that employ the example techniques described herein can continue to operate in a mode with compromised performance.

Advantages of the example techniques and motor systems described herein may include, for example, cost reduction of a BLDC motor by requiring fewer Hall sensors, easy implementation and maintenance without adding additional hardware or otherwise modifying existing hardware, and reliability and survivability improvements especially for high reliability requirement systems for critical applications, such as vehicle or weapon applications (e.g., an unmanned air vehicle). In some instances, the example detection techniques for identifying a failed Hall sensor and example motor commutation and position counter compensation techniques can be reliable for a motor with an arbitrary state, a varying rotation direction or rotation speed. Example techniques for inducing the movement of the motor are also provided to ensure that the failed Hall sensor can be identified even if the motor stops moving due to a failed Hall sensor (e.g., stuck at a non-commutation state or at the low point of the torque output). The example techniques and motor systems may achieve additional or different advantages in some other applications.

Figure 1A:
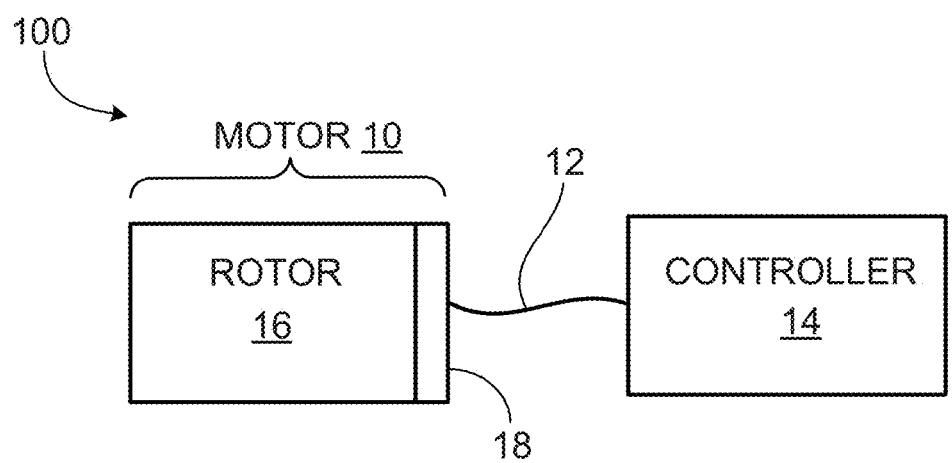
FIG. 1A is a schematic diagram of an example motor system.

FIG. 1A is a diagram showing an example motor system 100. The example motor system 100 includes a motor 10 coupled by a wiring harness 12 to a controller 14. The motor 10, for example can be a brushless DC motor (BLDC) that includes a rotor 16 and a sensor assembly 18. The sensor assembly 18 is connected to the controller 14 via the wiring harness 12. The motor 10 can be used, for example, at least in part of a servomotor system. In some instances, the motor 10 can be a part of an electromagnetic actuator utilized to control the position of a mechanical component, such as in an aircraft. The motor 10 can be used in other applications.

The controller 14 controls the operation of the motor 10, for example, its rotational position and/or speed depending on the application. In some implementations, multiple Hall sensors or other position sensors can be used by the motor 10. For example, multiple Hall sensors can be arranged at different angular positions to achieve corresponding partial indications of motor position. The outputs of all the sensors can be used to obtain more complete position information. The position information can be used, among other things, to control electronic commutation in the motors, to control the position of a mechanical component actuated by the motor, etc. A set of three Hall sensors (e.g., as described with respect to FIGS. 1B and 1C) can be used to indicate when commutation should occur for the widely used six-step drive routine. In other implementations, more sensors can be used, for example, to obtain finer-grain position information but with increased cost.

In some instances, a motor position counter (not shown) can be implemented (for example, in software or hardware) to record the transitions of the logic state of the Hall sensors and track the position of the motor. For example, the position counter may be updated by one count upon detection of a valid Hall state transition. The position counter value can increase or decrease depending on the direction of rotation of the motor. For example, the position counter may increase by one count if the detected valid Hall state transition is within the normal motor Hall state transition sequence when the motor moves clockwise (CW). Similarly, the position counter may decrease by one count if the detected Hall state transition is within the normal Hall state transition sequence when a motor moves counter clockwise (CCW). If no valid Hall state transition is detected, the position counter value can remain unchanged. Additional or different rules can be defined with respect to the position counter to track the motor position.

The controller 14 monitors the rotational position of the rotor 16 and controls the flow of current to the windings of the motor 10 to achieve a desired motor position and/or speed for a desired actuator movement. Different types of motor control arrangements and techniques may be utilized in different implementations. Specific hardware, software, firmware, or a combination thereof can be used for controlling winding currents. For example, certain circuitry and software logic can be designed to configure the controller for controlling drive currents (e.g., winding currents) into the motor.

Figure 1B:
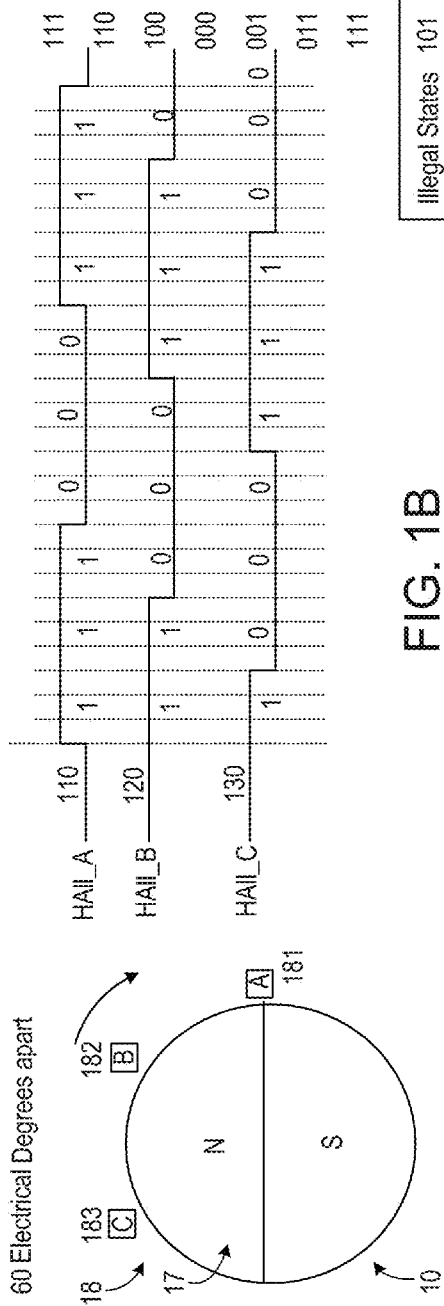
FIGS. 1B and 1C are diagrams showing example configurations of the sensor assembly 18 in FIG. 1A and example Hall sensor outputs.

FIG. 1B is a diagram showing an example configuration of the sensor assembly 18 in FIG. 1A. In the example configuration, the sensor assembly 18 includes three Hall sensors A 181, B 182, and C 183 that are separated by 60 electrical degrees. In some implementations, the motor can include the rotor 16 and a stator (not shown), and the sensor assembly 18 can be mounted on the stator of the motor 10. The motor 10 can include one or more permanent magnet pole pairs. The number of electrical rotation cycles per mechanical rotation depends on the number of permanent magnet pole pairs, given a particular motor design. For example, the degrees of electrical rotation can be obtained by the degrees of mechanical rotation multiplied by the number of pole pairs. In the example shown in FIGS. 1B and 1C, the motor 10 includes only one permanent magnet pole pair 17. In this case, one mechanical degree is equal to one electrical degree. The motor 10 can include another number of pole pairs and the mechanical degrees can have then a different relationship with respect to the electrical degree reference.

The three Hall sensors A 181, B 182, and C 183 can be digital Hall sensors that are operable to output binary values (e.g., 0 and 1). The binary values can represent a logic state of the Hall sensors. The output signals 110, 120, and 130 are example output signals of the Hall sensor A 181, Hall sensor B 182, and Hall sensor C 183, respectively. As motor 10 rotates, each of the three output signals 110, 120, and 130 switches in a binary fashion according to the rotation of the motor 10. The collective output signals 110, 120, and 130 can be used to control commutation. For example, at a certain time instance, the combination of the three output signals 110, 120, and 130 can form a logic state combination (also referred to as a Hall state). Eight logic state combinations can result from three output signals of binary values. Among the eight possible logic state combinations from the three sensors, 101 and 010 are faults or illegal states and they cannot appear during normal operations of the motor with three Hall sensors separated by 60 electrical degrees. Each of the remaining six distinct logic state combinations (i.e., 111, 110, 100, 000, 001, and 011) of the three binary outputs of the sensors maps to a corresponding commutation state. A commutation state indicates a particular pair of the motor windings driven with a current in a particular polarity.

Therefore, commutation can occur precisely at the time that the binary output from one of the sensors 181, 182, and 183 switches from one binary value to the other.

In the illustrated example, given that the motor rotates in a clockwise (CW) direction, the logic state combination of the three output signals 110, 120, and 130 transitions according to a sequence of 111, 110, 100, 000, 001, 011, and then 111. In some instances, since the motor can start from another position or rotate in another direction (e.g., counter clockwise (CCW)), the logic state combination of the three output signals 110, 120, and 130 can be different. The moving direction of the motor can be determined by monitoring the transitioning of the logic state combinations. For example, in the illustrated example in FIG. 1B, if a state transition from 000 to 001 is observed, it can be determined that the motor is moving in the CW direction; conversely, if a state transition from 001 to 000 is observed, it can be determined that the motor is moving in the CCW direction. In some instances, duration of a logic state combination can reflect a speed of the motor. In some implementations, the speed of the motor can be determined by the transition speed of the logic state combination.

Figure 1C:
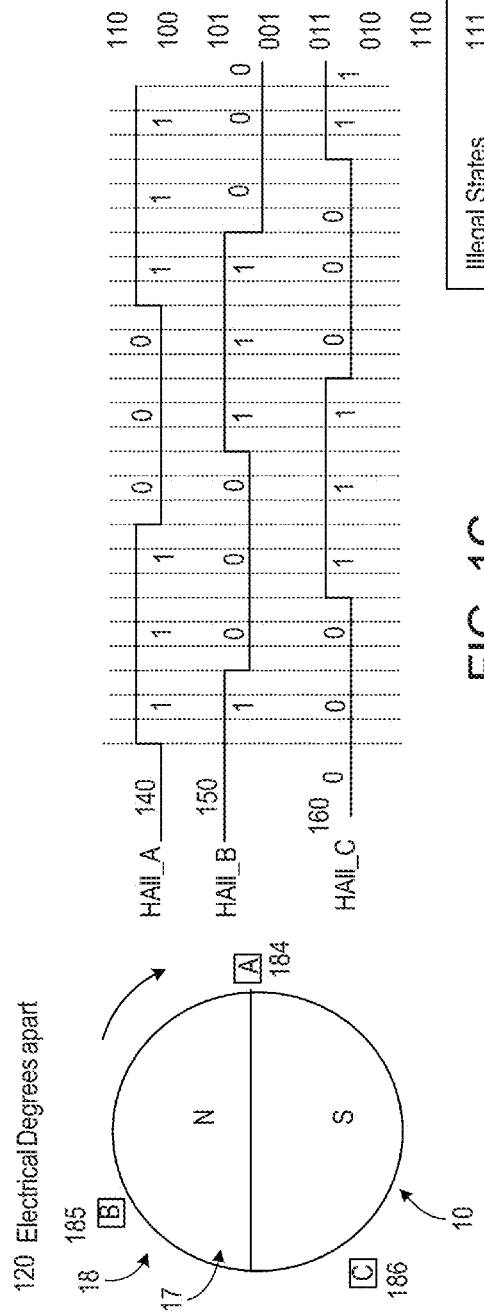

FIG. 1C is a diagram showing another example configuration of the sensor assembly 18 in FIG. 1. As illustrated, the sensor assembly 18 includes three Hall sensors A 184, B 185, and C 186 that are separated by 120 electrical degrees. The three Hall sensors A 184, B 185, and C 186 can be digital Hall sensors that are operable to output binary values (e.g., 0 and 1). Output signals 140, 150, and 160 are example output signals of the Hall sensor A 184, Hall sensor B 185, and Hall sensor C 186, respectively. The three output signals 140, 150, and 160 include binary values and can change according to a rotation of motor 10. In this case, where the three Hall sensors A 184, B 185, and C 186 are separated by 120 electrical degrees, 111 and 000 are faults or illegal states among eight possible logic state combinations of the output signals 140, 150, and 160. In the example shown in FIG. 1C, a CW rotation of the motor can lead to an example transition sequence of 110, 100, 101, 001, 011, 010, and then 110. A different sequence can be obtained based on another moving direction of the motor or another starting state. Similarly, the moving direction and speed of the motor 10 can be determined based on the transition of the logic state combination.

Figure 2:
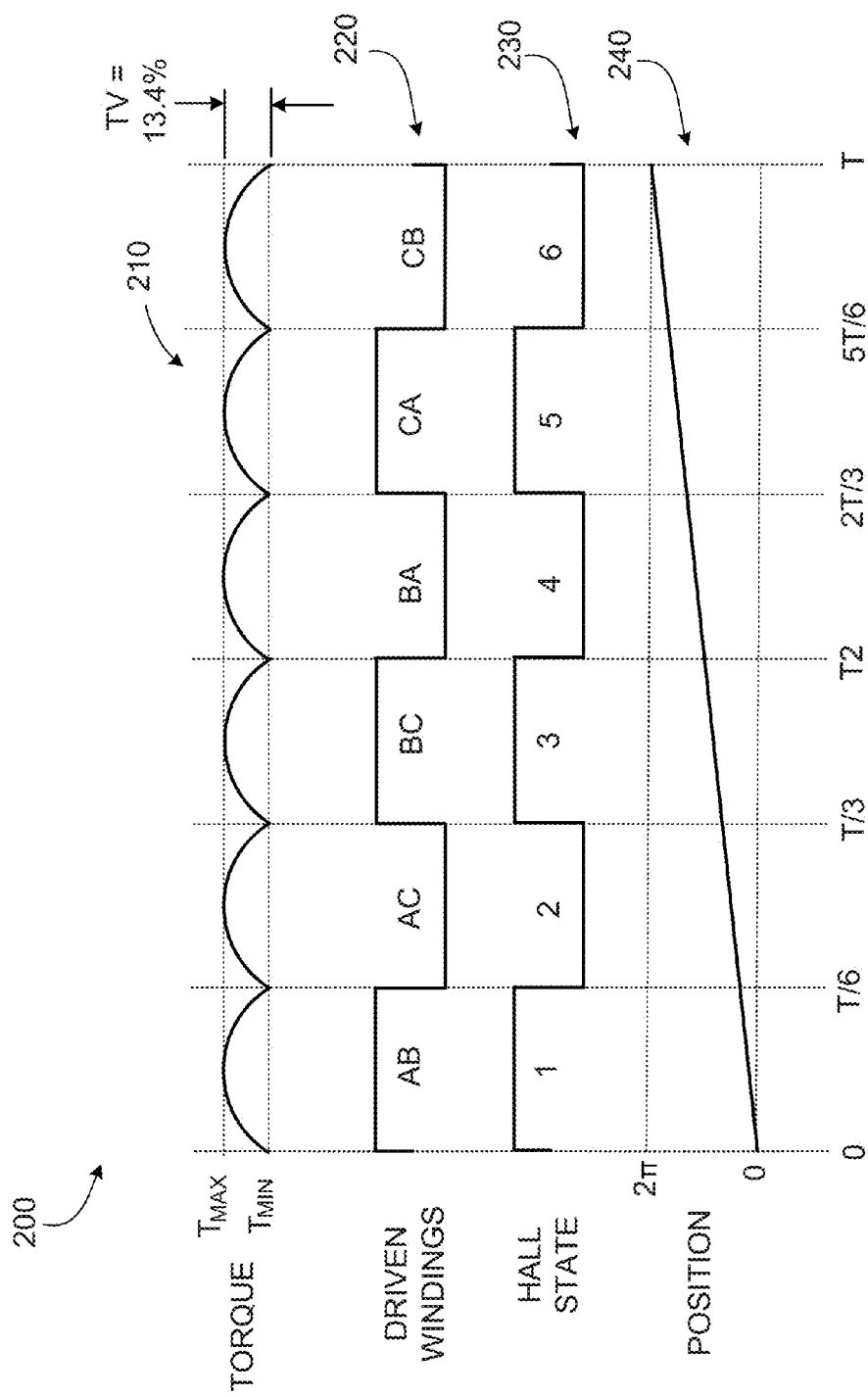
FIG. 2 is a plot showing an example operation of a motor system under normal operating conditions.

FIG. 2 is a diagram 200 showing an example operation of a motor system under normal operating conditions. The motor system can be the motor system 100 with the example motor 10 in FIG. 1A, or another motor system. The motor 10, for example, can include three Hall sensors separated by 60 electrical degrees as shown in FIG. 1B, or three Hall sensors separated by 120 electrical degrees as shown in FIG. 1C. One electrical rotation 240 from 0 to 2π radians is shown in FIG. 2. Time in FIG. 2 is indicated by fractions of the motor rotation period T. The motor is assumed to have three stator phase windings labeled as A, B and C. The windings are driven pair-wise in operation through six commutation states or commutation intervals during each revolution as generally known in the art. The scheme is also known as a six-step drive scheme or a six-step commutation scheme. An example sequence of commutation states, also called a "commutation sequence" 220, is shown as AB, AC, BC, BA, CA and CB in the illustrated example. The timing of the commutation sequence can be determined by the motor rotational position as indicated by the outputs of the Hall sensors, which are indicated by the sequence of "Hall states" 230. The example Hall state sequence 230 includes six Hall states, 1-6. Hall states 1-6 may correspond to different combinations of binary states of three Hall-effect sensors, for example, such as the six logic state combinations illustrated in FIG. 1B and FIG. 1C, respectively. Hall states 1-6 may include additional or different combinations depending on system configurations.

In some aspects of operation, a controller of the motor (e.g., the controller 14 of the motor 10) utilizes the position information from the Hall-effect sensors in order to control commutation of the motor windings to maintain motor rotation. For example, when the motor 16 is in a range of positions corresponding to Hall state 1 (e.g., from 0 to 60 electrical degrees), then the controller 14 drives the winding pair AB where the current flows into phase A and comes back from phase B. When the Hall-effect sensor signals transition to Hall state 2, the controller 14 switches or "commutates" the driving current to windings AC, etc. Thus, the driving of the motor windings is determined by the motor position information as indicated by the output signals of the Hall sensors.

Also shown in FIG. 2 is a plot of the motor torque 210, which has the characteristic of a sum of rectified portions of the three phase voltages (back EMF). The torque exhibits ripple with a magnitude shown as a "torque valley" (TV) of 13.4%. This value represents the relative difference between the minimum torque value $T_{MIN}$ (trough at the commutation points between commutation intervals) and the maximum torque value $T_{MAX}$ (at the middle of each commutation interval). If $T_{MAX}$ has a normalized value of 1 torque unit, for example, the $T_{MIN}$ has a normalized value of 0.866 units.

Figure 3:
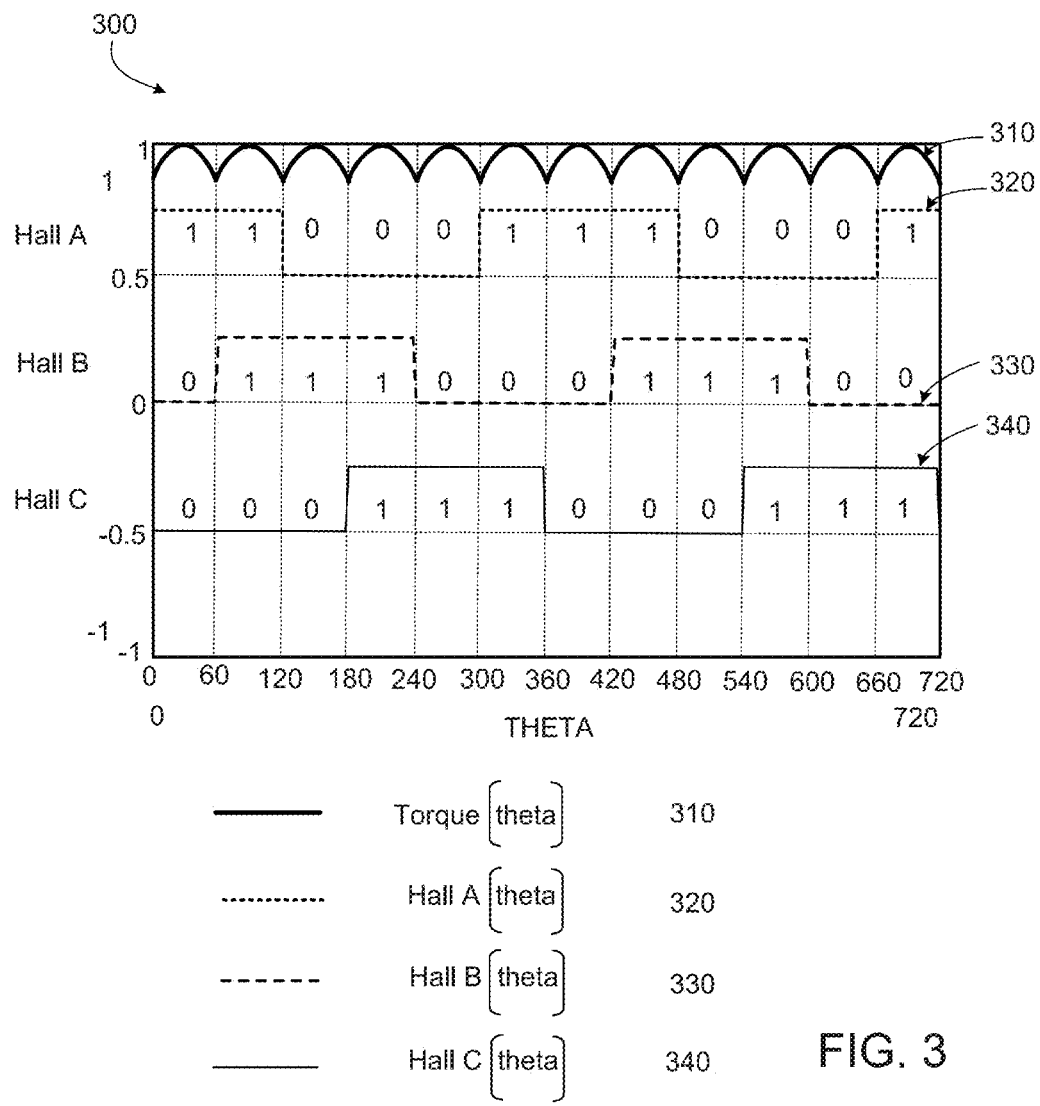
FIG. 3 is a plot showing another example operation of a motor system under normal operating conditions.

FIG. 3 is a plot 300 showing another example operation of a motor system under normal operating conditions. Unlike FIG. 2, which shows a single Hall state sequence 230, FIG. 3 includes the respective output signals of the three Hall sensors. The motor system of FIG. 3 includes three Hall sensors that are separated by 120 electrical degrees from each other (e.g., as shown in FIG. 1C). Output signals 320, 330, and 340 are respective output signals of the three Hall sensors A, B, and C. The combination of the three output signals 320, 330, and 340 at a time instance or interval (e.g., for θ∈60°~120°) is an example Hall state (e.g., Hall state 2) of the Hall state sequence 220 in FIG. 2. Signal 310 is the corresponding motor torque of the motor system with $T_{MAX}$ normalized to 1.

Figure 4:
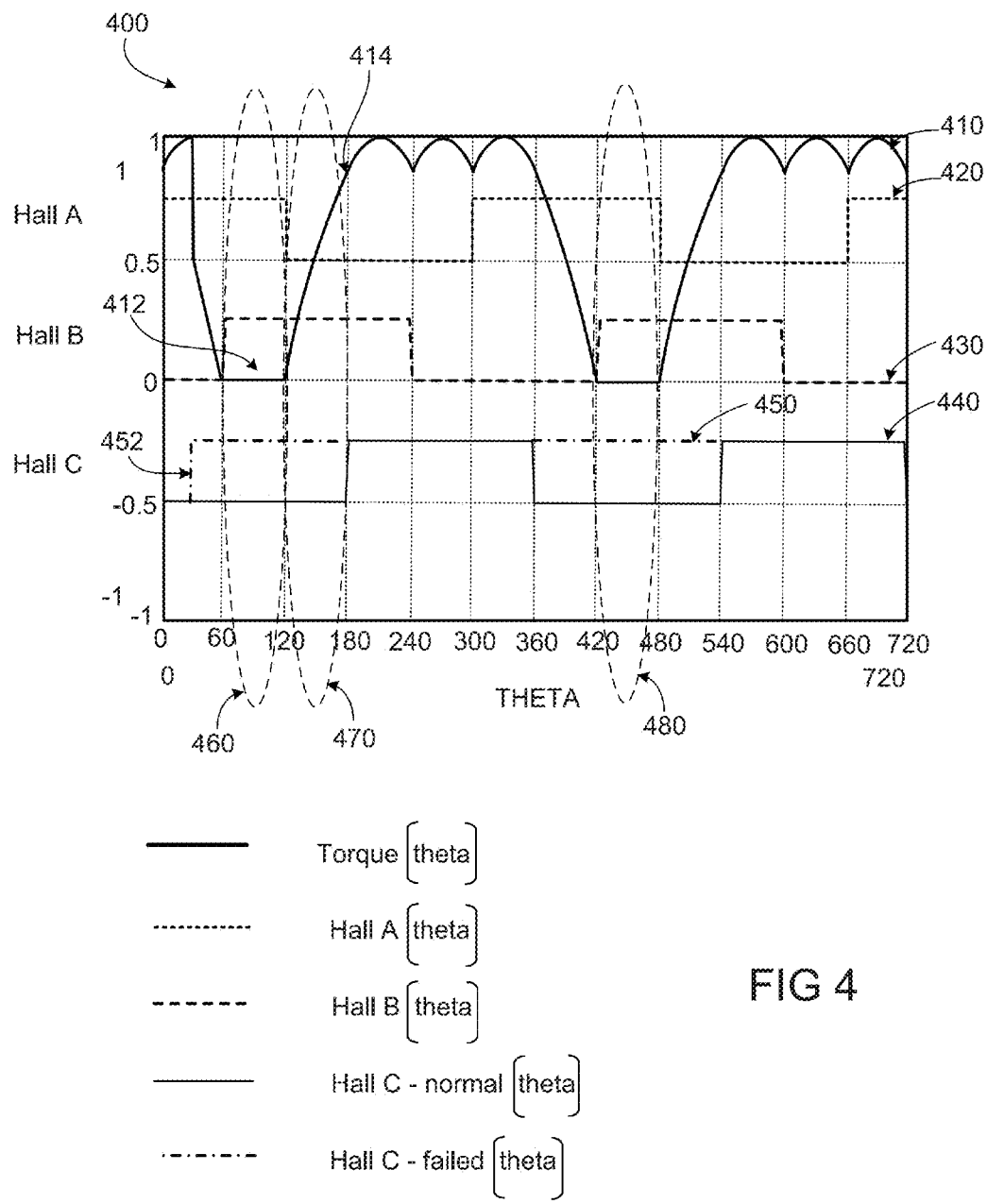
FIG. 4 is a plot showing an example operation of the motor system of FIG. 3 when the Hall sensor C has failed.

FIG. 4 is a plot 400 showing an example operation of the motor system of FIG. 3 when the Hall sensor C has failed. Signals 420, 430, and 440 are respective output signals of the three Hall sensors A, B, and C under normal operation. Assume the Hall sensor C is failed since at θ=30°, the actual output signal of the Hall sensor C is the signal 450, rather than the normal output signal 440 (as shown by the solid line). As illustrated, at 452, the output signal 450 of the failed Hall sensor C is stuck at high (binary value "1") and remains the same thereafter. The stuck output signal 450 causes an incorrect commutation step resulting an abrupt drop of the motor torque 410 at θ=30°. In the next state, 460, the logic state combination of the output signals 420, 430, and 450 are 111, a fault logic state combination for the example motor system. No commutation state is defined for the illegal state. The motor torque 410 drops to zero during the interval of θ∈60°~120°. In a next state, 470, the output signal 420 changes from 1 to 0 and the resulting logic state combination of the three output signals 420, 430, and 450 are 011, a legal logic state combination of the motor system, yet incorrect Hall output combination for this motor position, (the correct combination is 010). The controller can control the driving current into the motor according to the combination 011 and the compromised motor torque 414 climbs back from zero to 86.6% at θ=180°. During the following interval, θ∈180°~360°, the actual output signal 450 coincides with the normal output signal 440, therefore, the motor operates as normal and the motor torque 410 is the same as the corresponding torque 310 in FIG. 3 under normal operation. In the next revolution, θ∈360°~720°, the motor torque 450 starts to drop again from θ=360° and the motor repeats the similar operation as in the first revolution for θ∈0°~360°.

In some implementations, the failed Hall sensor may need to be identified before compensation can be applied. The failed Hall sensor can be identified based on detection of fault logic state combinations. For instance, given the output signals 420, 430, and 450, the fault logic state combination 111 is detected at 460. The output signals 420, 430, and 450 can be monitored continuously until an occurrence of a second fault logic state combination is detected (e.g., 111 at 480). In this example, the Hall sensor C can be identified as a failed Hall sensor since the output signal 450 of the Hall sensor C does not change throughout the period from 460 to 480. In other words, only two of the three output signals 420, 430, and 450 have changed during the period, and the "stuck" Hall sensor C can be confirmed as the failed Hall sensor. In the illustrated example, the second fault logic state combination at 480 is 360 electrical degrees away from the first fault logic state combination at 460.

In some instances, the motor may be stuck (not moving) at a fault Hall state (for example, due to zero or lower than normal torque output at a fault logic state combination or an incorrect commutation, such as 460 and 470 in FIG. 4) before the failed Hall sensor is identified. In this case, an example technique for inducing motor movement can be applied to force the motor to move. The example technique can include a sequencing routine to invert each Hall sensor signal to avoid getting stuck in the "no commutation state" or in the "incorrect commutation" (e.g., illegal Hall states 111 or 000). For instance, the example technique can include sequentially flipping one of the output signals of the Hall sensors A, B, and C from 0 to 1, or vice versa. Additional or different techniques to force the movement of the motor can be used.

The example technique to induce the movement of the motor can be applied, for example, when all or a subset of the following scenarios occur: 1) the motor is in a "dead torque" region (e.g., zero torque region 460 in FIG. 4); 2) outputs of the Hall sensors are sitting at an illegal Hall state (111 or 000 for Hall sensors with 120° separation, or 101 and 010 for Hall sensors with 60° separation); 3) the motor is not moving; 4) there is significant amount of enabled motor drive output; 5) the failed Hall sensor has NOT been identified yet. Additional or different conditions may apply.

In some instances, the example detection techniques described herein can be accurate and robust regardless of the starting state, rotation speed, or rotation direction of the motor. For example, unlike other methods (e.g., the prediction method that estimates a current motor speed and direction and predicts a next logic state combination based on the estimated motor speed and direction), the example detection technique can work well even if the motor changes its rotation direction or speed, or even when the motor stops moving. Once the failed Hall sensor is identified, the motor commutation techniques can be applied to the output signal of the failed Hall sensor.

Figure 5:
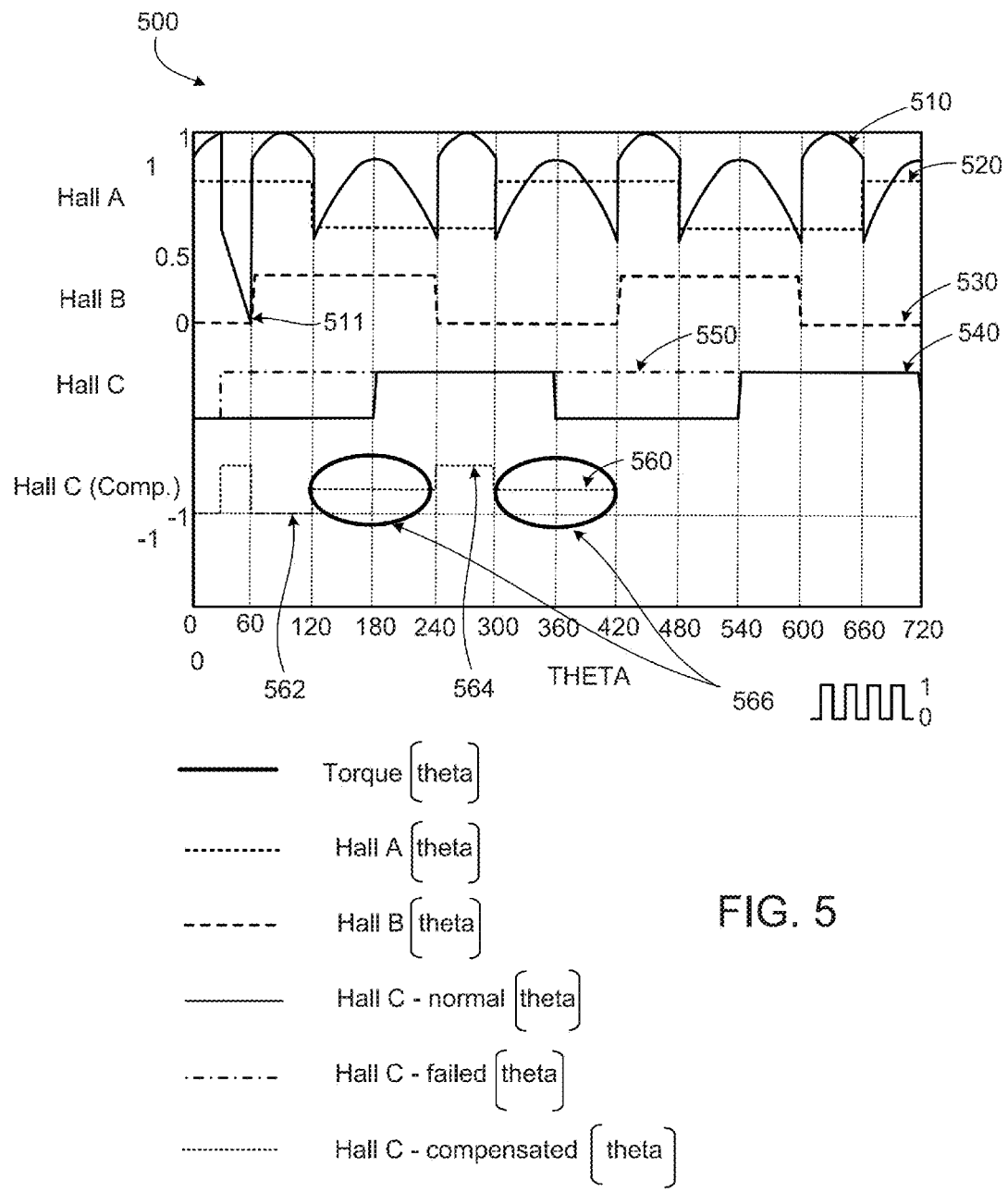
FIG. 5 is plot showing an example operation of the motor system of FIG. 3 with example compensation applied with respect to the failed Hall sensor C.

FIG. 5 is a plot 500 showing an example operation of the motor system of FIG. 3 with example compensation applied to the failed Hall sensor C. Signals 520, 530, 540, and 550 are the same as 420, 430, 440, and 450 that correspond to the output signals of the Hall sensors A and B under normal operation, and the output signal of Hall sensor C that is failed since θ=30°, respectively. The signal 560 is the compensated output signal of the Hall sensor C with compensation starting applied at θ=60°. More specifically, when a fault logic state combination is detected, the compensated output signal 560 can be determined to toggle to 0, when in the 111 fault logic state combination (e.g., at 562), or to toggle to 1 when in 000 fault logic state combination (e.g., at 564). In all other Hall states (e.g., at 566), the compensated output signal 560 can be determined to be alternating between 0 and 1 at a high frequency (but shown as value 0.5 for illustration purposes in FIG. 5). The alternation frequency may need to be no less than a maximum state transition frequency of the motor. The maximum state transition frequency can depend on the maximum operating speed of the motor. For example, if the maximum motor speed is 15,000 RPM, i.e., 250 revolutions/second, there can be 24 Hall state transitions per motor revolution for an 8-pole motor. In this case, 250 revolutions/sec*24 Hall states/rev=6000 Hall states/sec, and the alternating frequency may be at least of 6000 Hz. In some instances, the maximum state transition frequency can be determined or otherwise specified in another manner.

FIG. 5 also shows a motor torque 510 resulting from the compensated output signal 560. As illustrated, the motor torque 510 climbs up from zero at 511 to the normal motor torque during the interval of θ∈60°~120° due to the compensation applied at 562 (changing the fault logic state combination 111 to the legal state 110). In the next interval of θ∈120°~240°, the compensated output signal 560 alternates frequently between binary values 0 and 1. One of the two binary values will be the correct logic state combination at each of the considered 60° intervals; the application of this alternating compensation between the binary values recovers motor output torque at minimum 50% of the normal torque output level. For instance, if 1 is the correct logic state of the Hall sensor C at a considered interval (e.g., at interval θ∈180°~240°), the motor torque output would be at 100% of the normal torque output level when the alternating compensated output signal 560 becomes 1, but the output torque would decrease from the normal level when the compensated output signal 560 becomes 0. The average torque output 510 during this interval, though reduced from the full torque (e.g., torque 310 under normal operations), is higher than or at least equal to 50% of the normal torque output level. The application of the compensated output of Hall C 560 eliminates the torque output dead spot (e.g., zero torque regions 412 in FIG. 4). Compared with the motor torque output 410 when no compensation is applied, the motor torque 510 increases the torque valley from 0% (dead spot) under fault logic state to 50% at θ=120° maintains at 86.6% at θ=180° reduces from ideal 86.6% to 50% at θ=240° when the compensation is applied.

Table 1 is an example commutation truth table for a motor with Hall sensors separated by 120 electrical degrees. The example commutation truth table shows the motor commutation compensation scheme for the case that Hall sensor C is the failed. Commutation truth table for the case that Hall sensor B or A is the failed can be obtained accordingly. The output signal of the Hall sensor C can be determined based on example compensation techniques described with respect to FIGS. 4 and 5. Table 1 shows an example drive scheme or motor commutation scheme based on the output signals of Hall sensors A and B, and the compensated output signal of the Hall sensor C.

For example, in row 1, given the output signals of Hall sensors A and B are the same binary value 0, the compensated output of the failed Hall sensor C is the other binary value 1. Thus, the logic state combination is 001 and the winding pair C and A can be driven according to Table 1. Specifically, the current is driven such that it flows into phase C and comes back from phase A if the motor is moving counter clockwise (CCW), or the current is input into phase A and output from phase C if the motor is moving clockwise (CW). Note that, with compensated output signal of the Hall sensor C, at the logic state combination 001, a full torque can be obtained as discussed above with respect to FIG. 5. In a next Hall state shown in rows 2 and 3, the output signals of the Hall sensors A and B are different, and the compensated output signal of the Hall sensor C is alternating between 0 and 1. When the compensated output signal of the Hall sensor C hits 1, the winding pair BA is driven, and when the compensated output signal of the Hall sensor C hits 0, the winding pair BC is driven. With this compensated Hall state C output scheme, the resultant motor torque output is lower compared to the motor torque that can be obtained under the no Hall failure condition, yet, there is no torque output dead spot, and a minimum of 50% of the normal torque level can be achieved as described with respect to FIG. 5 and in the previous paragraphs. The commutation of drive current for other logic state combinations can be controlled in a similar manner according to rows 3-6 of Table 1. In some implementations, the mapping among the commutation of the drive current, the rotation directions, and the logic state combinations can be configured differently. Additional or different commutation truth tables can be used for controlling the commutation of the drive current into the motor.

In some instances, the example commutation scheme described with respect to Table 1 can be referred to as a four-step commutation scheme or a four-step drive scheme because it includes four distinctive motor feedback logic combinations. Compared with the standard 3-phase motor six-step drive scheme that corresponds to each of the six rows in Table 1, the four-step commutation scheme combines four of the six steps into two steps. Specifically, in the example shown in Table 1, rows 2 and 3 corresponding to two steps of the six-step drive scheme are combined into one step, and rows 5 and 6 are combined into another step of the four-step drive scheme. In some instances, the four-step drive scheme can be represented with reference to the standard 3-phase motor six-step drive scheme as step 1, step 2/3, step 4, and step 5/6.

In some implementations, due to a failed Hall sensor, a motor position counter that tracks position information of the motor may lose counts and render inaccurate position information. For example, as shown in FIG. 4, the position counter may lose a count at θ=180° where no state transition is detected because the output signal 450 is stuck at 1. Example techniques for compensating the motor position counter are described below in relation to the Tables 2-4 for a motor with Hall sensors separated by 120 electrical degrees. Throughout Tables 2-4, 0 represents CW direction while 1 represents CCW direction (under column "Dir"). The position counter is incremented (shown as "+") when the motor is moving CW, while the position counter is decremented (shown as "−") when the motor is moving CCW. "Pre1" represents one Hall state previous to a current Hall state, "Pre2" represents two Hall state previous to the current Hall state. "PC" represents position counter and "SEQ" represents sequence.

Table 2 shows example position and commutation compensation techniques in the case that the Hall sensor C is failed. The example techniques work no matter if the failed Hall sensor C is stuck at 0 or at 1. At row 1, the failed Hall sensor C is identified and confirmed, for example, according to the example detection technique described with respect to FIG. 4. Compensation for commutation can be applied starting from row 2, for example, by using the example commutation compensation techniques described with respect to FIG. 5 and Table 1. The correct Hall state transitions can be determined based on the output signals of the Hall sensors A and B. For example, the current Hall state and the previous state Pre1 can be compared. If the current state is the same as the Pre1, the position counter does not need to change. If the current state is different from the Pre1, additional operations are needed to determine how many counts need to be updated. For instance, when the output signals of Hall sensors A and B are the same (changed from the Pre1 state when they were not the same), the current state is further compared with Pre2. The position counter is updated by two counts if the current state is different from the Pre2 state, whereas the counter is updated by 1 count if the current state is the same as the Pre2 state. In some instances, the rotation direction of the motor can be determined based on the Hall output logic state transition from Pre1 state to the current state, for example, by determining if the detected logic state transition is valid according to a

TABLE 1

Example Commutation Table of a Motor with Hall Sensors Separated by 120°
(Hall C Failed Case)

| Row # | Hall-A | Hall-B | Hall C (Compensated)/ Derived Signal | Motor Current Commutation (CCW) | Motor Current Commutation (CW) | Torque Output |
|---|---|---|---|---|---|---|
| 1 | 0 | 0 | 1 | Phase_C --> Phase_A | Phase_A ---> Phase_C | Full TQ output |
| 2 | 0 | 1 | (when alternating to) 1 | Phase_B ---> Phase_A | Phase_A ---> Phase_B | Reduced TQ |
| 3 | 0 | 1 | (when alternating to) 0 | Phase_B ---> Phase_C | Phase_C ---> Phase_B | output |
| 4 | 1 | 1 | 0 | Phase_A ---> Phase_C | Phase_C ---> Phase_A | Full TQ output |
| 5 | 1 | 0 | (when alternating to) 0 | Phase_A ---> Phase_B | Phase_B ---> Phase_A | Reduced TQ |
| 6 | 1 | 0 | (when alternating to) 1 | Phase_C ---> Phase_B | Phase_B ---> Phase_C | output |
| 7 | 0 | 0 | 1 | Phase_C --> Phase_A | Phase_A ---> Phase_C | Full TQ output |

CW state transition sequence, or it follows the CCW valid state transition sequence; the motor position counter then updates accordingly and motor commutation compensation scheme applied. A valid state transition under the compensation operating mode is a transition where there is only one Hall output binary value change from previous state combination to the current state combination, and the transition is according to the proper CCW or the CW sequence.

In the example shown in Table 2, from row 1 to row 2, the outputs of Hall sensors A and B remain the same (i.e., 10), therefore, no state transition is detected. From row 2 to row 3, the outputs of Hall sensors A and B change from 10 into 11 and hence a state transition is detected. Since the two output signals are the same, the current Hall state 11 of row 3 is further compared with the Pre2 state 00. Given that the current state 11 is different from the Pre2 state 10, the position counter is updated by 2 counts instead of 1 count (for example, to make up for the missed count for state transition from row 1 to row 2). In the next transition from row 3 to row 4, the Hall state changes from 11 to 01, where the current output signals of the Hall sensors A and B are different. Therefore this state transition triggers the position counter to be updated by 1 count. The rules can be applied to other rows accordingly. Note that in row 10, the motor changes its rotation direction from CW to CCW by one state. Such a direction change can be identified, for example, by determining that the transition from state 11 of row 9 to state 10 of row 10 is within the normal valid CCW state transition logic state sequence. Accordingly, the position counter is decremented by 1 count. In a next state, the motor continues to move in the CW direction from state 10 of row 10 into state 11 of row 11. Now the two output signals are the same, the current state 11 of row 11 is further compared with the Pre2 state 11 corresponding to row 9. Since the current state 11 is the same as Pre2 state 11, it can be determined that the motor rotates back in the other direction in a previous state and there is no missed count to compensate for. In this case, the position counter is updated by only 1 count. Also shown in Table 2 are example values of a theoretical position counter and the actual position counter. As illustrated, the actual position counter with the position compensation techniques applied can track the theoretical position counter closely once the failed Hall sensor is identified. For example, the actual position counter may be offset at most by one count, in some instances, but can be recovered or compensated to the accurate counter value within one or two states.

Tables 3 and 4 show example position and commutation compensation techniques when Hall sensors A and B are failed, respectively. When a motor includes at least three Hall sensors A, B, and C separated by 120 electrical degrees (e.g., as shown in FIG. 1C), the three Hall sensors are effectively equivalent. The example compensation techniques for failed Hall sensor C described above can be applied in a similar manner to the cases where the Hall sensor A or B has failed.

TABLE 2

Example Position & Commutation Compensations Techniques for a Motor with Hall Sensors Separated by 120°
(Failed Hall Sensor C)

| Row # | Remarks | Dir | Normal Hall State SEQ Normal | | | Failed Hall State ('0' or '1') SEQ Current | | | Pre1 ABC | Pre2 ABC | Transition Detection | Transition generated? | Update Commutation State | Update PC | theoretical PC | Actual PC |
|---|---|---|---|---|---|---|---|---|---|---|---|---|---|---|---|---|
| | | | a | b | c | A | B | C | | | | | | | | |
| 1 | Failure on Hall C confirmed, with output at '0' or '1' | | 1 | 0 | 1 | 1 | 0 | 0/1 | | | | | | | | |
| 2 | Compensation Applied | 0 | 1 | 0 | 0 | 1 | 0 | 0/1 | 00x | 01x | no change detected | n | Toggle Hall C 0/1 | no change | 1 | 0 |
| 3 | | 0 | 1 | 1 | 0 | 1 | 1 | 0/1 | 10x | 00x | from Pre1 (A != B) to Current (A = B) & Pre2 (AB) != Current (AB) | y | For A = B = '1', Set Hall C to '0' | +2 | 2 | 2 |
| 4 | | 0 | 0 | 1 | 0 | 0 | 1 | 0/1 | 11x | 10x | from Pre1 (A = B) to Current (A != B) | y | Toggle Hall C 0/1 | +1 | 3 | 3 |
| 5 | | 0 | 0 | 1 | 1 | 0 | 1 | 0/1 | | | no change detected | n | Toggle Hall C 0/1 | no change | 4 | 3 |
| 6 | | 0 | 0 | 0 | 1 | 0 | 0 | 0/1 | 01x | 11x | from Pre1 (A != B) to Current (A = B) & Pre2 (AB) != Current (AB) | y | For A = B = '0' set Hall C to '1' | +2 | 5 | 5 |

TABLE 2-continued

Example Position & Commutation Compensations Techniques for a Motor with Hall Sensors Separated by 120°
(Failed Hall Sensor C)

| Row # | Remarks | Dir | Normal Hall State SEQ Normal | | | Failed Hall State ('0' or '1') SEQ Current | | | Pre1 ABC | Pre2 ABC | Transition Detection | Transition generated? | Update Commutation State | Update PC | theoretical PC | Actual PC |
|---|---|---|---|---|---|---|---|---|---|---|---|---|---|---|---|---|
| | | | a | b | c | A | B | C | | | | | | | | |
| 7 | | 0 | 1 | 0 | 1 | 1 | 0 | 0/1 | 00x | 01x | from Pre1 (A = B) to Current (A != B) | y | Toggle Hall C 0/1 | +1 | 6 | 6 |
| 8 | | 0 | 1 | 0 | 0 | 1 | 0 | 0/1 | | | no change detected | n | Toggle Hall C 0/1 | no change | 7 | 6 |
| 9 | | 0 | 1 | 1 | 0 | 1 | 1 | 0/1 | 10x | 00x | from Pre1 (A != B) to Current (A = B) & Pre2 (AB) != Current (AB) | y | for A = B = '1' Set Hall C to '0' | +2 | 8 | 8 |
| 10 | direction change motor moves back one state | 1 | 1 | 0 | 0 | 1 | 0 | 0/1 | 11x | 10x | from Pre1 (A = B) to Current (A != B) | y | Toggle Hall C 0/1 | -1 | 7 | 7 |
| 11 | | 0 | 1 | 1 | 0 | 1 | 1 | 0/1 | 10x | 11x | from Pre1 (A != B) to Current A = B), & Pre2 (AB)= Current (AB) | y | for A = B = '1' Set Hall C to '0' | +1 | 8 | 8 |
| 12 | | 0 | 0 | 1 | 0 | 0 | 1 | 0/1 | 11x | 10x | from Pre1 (A = B) to Current (A != B) | y | Toggle Hall C 0/1 | +1 | 9 | 9 |
| 13 | | 0 | 0 | 1 | 1 | 0 | 1 | 0/1 | | | no change detected | n | Toggle Hall C 0/1 | no change | 10 | 9 |
| 14 | | 0 | 0 | 0 | 1 | 0 | 0 | 0/1 | 01x | 11x | from Pre1 (A != B) to Current (A = B) & Pre2 (AB) != Current (AB) | y | ForA = B = '0' then set Hall C to '1' | +2 | 11 | 11 |

TABLE 3

Example Position & Commutation Compensations Techniques for a Motor with Hall Sensors Separated by 120°
(Failed Hall Sensor A)

| Row # | Remarks | Dir | Normal Hall State Sequence Normal | | | Failed Hall A ('0' or '1') State Sequence Current | | | Pre1 ABC | Pre2 ABC | Transition Detection | Transition generated? | Update Commutation State | Update position counter | theoretical position counter | Actual position counter |
|---|---|---|---|---|---|---|---|---|---|---|---|---|---|---|---|---|
| | | | a | b | c | A | B | C | | | | | | | | |
| 1 | Failure on Hall A confirmed, with output stuck at '0' or '1' | | 0 | 0 | 1 | 0/1 | 0 | 1 | | | | | | | | |
| 2 | Compensation Applied | | 1 | 0 | 1 | 0/1 | 0 | 1 | | | no change detected | n | Toggle Hall A 0/1 | no change | 1 | 0 |

TABLE 3-continued

Example Position & Commutation Compensations Techniques for a Motor with Hall Sensors Separated by 120°
(Failed Hall Sensor A)

| Row # | Remarks | Normal Hall State Sequence Normal Dir | a | b | c | Failed Hall A ('0' or '1') State Sequence Current A | B | C | Pre1 ABC | Pre2 ABC | Transition Detection | Transition generated? | Update Commutation State | Update position counter | theoretical position counter | Actual position counter |
|---|---|---|---|---|---|---|---|---|---|---|---|---|---|---|---|---|
| 3 | | 0 | 1 | 0 | 0 | 0/1 | 0 | 0 | x01 | x11 | from Pre1 (C != B) to Current (C = B) & Pre2 (AB) != Current (AB) | y | for B = C = '0' Set Hall A to '1' | +2 | 2 | 2 |
| 4 | | 0 | 1 | 1 | 0 | 0/1 | 1 | 0 | X00 | x01 | from Pre1 (C = B) to Current (C != B) | y | Toggle Hall A 0/1 | +1 | 3 | 3 |
| 5 | | 0 | 0 | 1 | 0 | 0/1 | 1 | 0 | X00 | x01 | no change detected | n | Toggle Hall A 0/1 | no change | 4 | |
| 6 | | 0 | 0 | 1 | 1 | 0/1 | 1 | 1 | x10 | X00 | from Pre1 (C != B) to Current (C = B) & Pre2 (AB) != Current (AB) | y | for C = B = '1' Set Hall A to '0' | +2 | 5 | 5 |
| 7 | | 0 | 0 | 0 | 1 | 0/1 | 0 | 1 | x11 | x10 | from Pre1 (C = B) to Current (C != B) | y | Toggle Hall A 0/1 | +1 | 6 | 6 |
| 8 | | 0 | 1 | 0 | 1 | 0/1 | 0 | 1 | x11 | x10 | no change detected | n | Toggle Hall A 0/1 | no change | | |
| 9 | | 0 | 1 | 0 | 0 | 0/1 | 0 | 0 | x01 | x11 | from Pre1 (C != B) to Current (C = B) & Pre2 (AB) != Current (AB) | y | for B = C = '0' Set Hall A to '1' | +2 | 7 | 6 |
| 10 | | 0 | 1 | 1 | 0 | 0/1 | 1 | 0 | x00 | x01 | from Pre1 (C = B) to Current (C != B) | y | Toggle Hall A 0/1 | +1 | 8 | 8 |
| 11 | direction change motor moves back one state | 1 | 1 | 0 | 0 | 0/1 | 0 | 0 | x10 | x00 | from Pre1 (C != B) to Current (C = B) & Pre2 (AB) = Current (AB) | y | Toggle Hall A 0/1 | −1 | 7 | 7 |
| 12 | | 0 | 1 | 1 | 0 | 0/1 | 1 | 0 | x00 | x10 | from Pre1 (C = B) to Current (C != B) | y | Toggle Hall A 0/1 | +1 | 8 | 8 |
| 13 | | 0 | 0 | 1 | 0 | 0/1 | 1 | 0 | x00 | x10 | no change detected | n | Toggle Hall A 0/1 | no change | 9 | 9 |

TABLE 3-continued

Example Position & Commutation Compensations Techniques for a Motor with Hall Sensors Separated by 120°
(Failed Hall Sensor A)

| Row # | Remarks | Dir | Normal Hall State Sequence Normal | | | Failed Hall A ('0' or '1') State Sequence Current | | | Pre1 | Pre2 | Transition | Transition | Update | Update | theoretical | Actual |
| | | | a | b | c | A | B | C | ABC | ABC | Detection | generated? | Commutation State | position counter | position counter | position counter |
|---|---|---|---|---|---|---|---|---|---|---|---|---|---|---|---|---|
| 14 | | 0 | 0 | 1 | 1 | 0/1 | 1 | 1 | x10 | x00 | from Pre1 (C != B) to Current (C = B) & Pre2 (AB) != Current (AB) | n | for C = B = '1' Set Hall A to '0' | +2 | 10 | 10 |
| 15 | | 0 | 0 | 0 | 1 | 0/1 | 0 | 1 | x11 | x10 | from Pre1 (C = B) to Current (C != B) | y | Toggle Hall A 0/1 | +1 | 11 | 11 |

TABLE 4

Example Position & Commutation Compensations Techniques for a Motor with Hall Sensors separated by 120°
(Failed Hall Sensor B)

| Row # | Remarks | Dir | Normal Hall State Sequence Normal | | | Failed Hall B ('0' or '1') State Sequence Current | | | Pre1 | Pre2 | Transition | Transition | Update | Update | theoretical | Actual |
| | For 120 electrical deg separation hall sensor arrangement Motors | | a | b | c | A | B | C | ABC | ABC | Detection | generated? | Commutation State | position counter | position counter | position counter |
|---|---|---|---|---|---|---|---|---|---|---|---|---|---|---|---|---|
| 1 | Failure on Hall B confirmed, with output at '0' or '1' | | 0 | 0 | 1 | 0 | 0/1 | 1 | | | no change detected | n | | no change | 1 | 0 |
| 2 | Compensation Applied | | 1 | 0 | 1 | 1 | 0/1 | 1 | 0x1 | 1x0 | from Pre1 (C != A) to Current (C = AC) & Pre2 (AC) != Current (AC) | y | for C = A = '1' Set Hall B to '0' | +2 | 2 | 2 |
| 3 | | 0 | 1 | 0 | 0 | 1 | 0/1 | 0 | 1x1 | 0x1 | from Pre1 (C = A) to Current (C != A) | y | Toggle Hall B 0/1 | +1 | 3 | 3 |
| 4 | | 0 | 1 | 1 | 0 | 1 | 0/1 | 0 | 1x1 | 0x1 | no change detected | n | Toggle Hall B 0/1 | no change | | |
| 5 | | 0 | 0 | 1 | 0 | 0 | 0/1 | 0 | 1x0 | 1x1 | from Pre1 (C != A) to Current (C = AC) & Pre2 (AC) != Current (AC) | y | for A = C = '0' Set Hall B to '1' | +2 | 4 | 4 |

TABLE 4-continued

Example Position & Commutation Compensations Techniques for a Motor with Hall Sensors separated by 120°
(Failed Hall Sensor B)

| Row # | Remarks | For 120 electrical deg separation hall sensor arrangement Motors Dir | Normal Hall State Sequence Normal | | | Failed Hall B ('0' or '1') State Sequence Current | | | Pre1 ABC | Pre2 ABC | Transition Detection | Transition generated? | Update Commutation State | Update position counter | theoretical position counter | Actual position counter |
|---|---|---|---|---|---|---|---|---|---|---|---|---|---|---|---|---|
| | | | a | b | c | A | B | C | | | | | | | | |
| 6 | | 0 | 0 | 1 | 1 | 0 | 0/1 | 1 | 0x0 | 1x0 | from Pre1 (C = A) to Current (C != A) | y | Toggle Hall B 0/1 | +1 | 5 | 5 |
| 7 | | 0 | 0 | 0 | 1 | 0 | 0/1 | 1 | 0x0 | 1x0 | no change detected | n | Toggle Hall B 0/1 | no change | 6 | 5 |
| 8 | | 0 | 1 | 0 | 1 | 1 | 0/1 | 1 | 0x1 | 0x0 | from Pre1 (C != A) to Current (C = AC) & Pre2 (AC) != Current (AC) | y | for C = A = '1' Set Hall B to '0' | +2 | 7 | 7 |
| 9 | | 0 | 1 | 0 | 0 | 1 | 0/1 | 0 | 1x1 | 0x1 | from Pre1 (C = A) to Current (C != A) | y | Toggle Hall B 0/1 | +1 | 8 | 8 |
| 10 | | 0 | 1 | 1 | 0 | 1 | 0/1 | 0 | 1x1 | 0x1 | no change detected | n | Toggle Hall B 0/1 | no change | 9 | 8 |
| 11 | direction change motor moves back one state | 1 | 1 | 0 | 0 | 1 | 0/1 | 0 | 1x1 | 0x1 | no change detected | n | Toggle Hall B 0/1 | no change | 8 | 8 |
| 12 | | 0 | 1 | 1 | 0 | 1 | 0/1 | 0 | 1x1 | 0x1 | no change detected | n | Toggle Hall B 0/1 | no change | 9 | 8 |
| 13 | | 0 | 0 | 1 | 0 | 0 | 0/1 | 0 | 1x0 | 1x1 | from Pre1 (C != A) to Current (C = AC) & Pre2 (AC) != Current (AC) | y | for A = C = '0' Set Hall B to '1' | +2 | 10 | 10 |
| 14 | | 0 | 0 | 1 | 1 | 0 | 0/1 | 1 | 0x0 | 1x0 | from Pre1 (C = A) to Current (C != A) | y | Toggle Hall B 0/1 | +1 | 11 | 11 |
| 15 | | 0 | 0 | 0 | 1 | 0 | 0/1 | 1 | 0x0 | 1x0 | no change detected | y | Toggle Hall B 0/1 | no change | 12 | 11 |
| 16 | | 0 | 1 | 0 | 1 | 1 | 0/1 | 1 | 0x1 | 0x0 | from Pre1 (C != A) to Current (C = AC) & Pre2 (AC) != Current (AC) | y | for A = C = '1' Set Hall B to '0' | +2 | 13 | 13 |

Figure 6A:
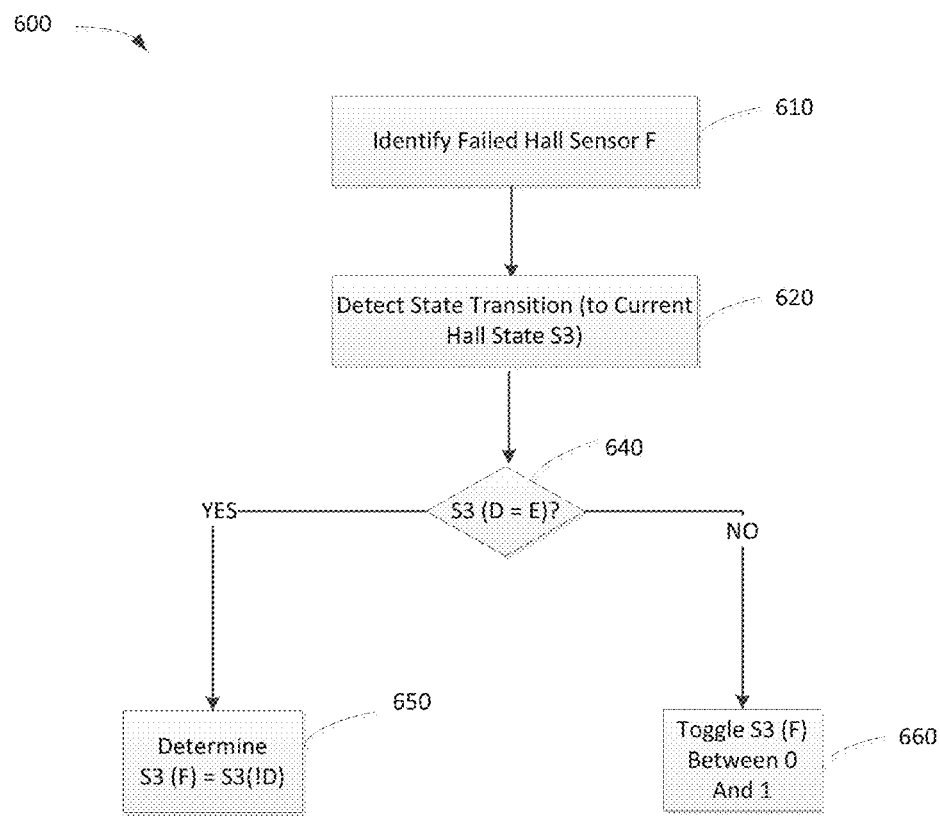
FIG. 6A is a flow chart showing an example process for compensating commutation and FIG. 6B is a flow chart showing an example process for compensating a position counter for a motor that includes three Hall sensors separated by 120 electrical degrees.

FIG. 6A is a flow chart showing an example process 600 for compensating commutation of a motor that includes three Hall sensors separated by 120 electrical degrees. All or part of the example process 600 may be implemented in hardware, software, firmware, or a combination thereof. In some instances, the example process 600 can be implemented as an example algorithm for the controller 14 for controlling the motor commutation of the motor 10 shown in FIG. 1. The example process 600 can embody the compensation techniques described with respect to FIGS. 4 and 5 and Tables 2-4. The process 600, individual operations of the process 600, or groups of operations may be iterated or performed in parallel, in series, or in another manner. In some cases, the process 600 may include the same, additional, fewer, or different operations performed in the same or a different order.

At 610, a failed Hall sensor is identified. For purposes of the examples in FIGS. 6A and 6B, it is assumed that the failed Hall sensor is F and the two good Hall sensors are D and E. The Hall sensors D, E, and F can be digital Hall sensors that are configured to output binary values (e.g., 0 and 1) and the output signals of the Hall sensors D, E, and F can be monitored. In some instances, the Hall sensor F can be any one of the example Hall sensors 184, 185, and 186 in FIG. 1C. The failed Hall sensor F can be the failed Hall sensor C, A, and B as shown in Tables 2-4, respectively. In some implementations, the failed Hall sensor F can be identified based on output signals of the Hall sensors, for example, according to the example detection techniques described with respect to FIG. 4, or in another manner.

At 620, a new logic state combination transition (or a state transition) can be monitored and detected. For example, the Hall sensor output logic state combination can transition to a current logic state combination S3 as motor rotates. The logic state combination can be a combination of the output binary values of the Hall sensors D and E (for example, 00, 01, 11, and 10). A valid transition of the logic state combination can be detected based on an in sequenced change of the output signals of the Hall sensors D and E. Example transitions of the logic state combination are shown in Tables 2-4. As an example, the current logic state combination S3 can be 11 in row 3 of Table 2, which is transitioned from 10 in row 2 of Table 2. No state transition is detected from row 1 to row 2 of Table 2 because the output signals of the two Hall sensors remain as 10 and no change is detected.

At 640, the two output signals of the Hall sensors D and E at the current Hall state S3 are compared. For example, if S3 includes two of the same binary values (e.g., 11 or 00), the compensated output signal of the failed Hall sensor F for motor commutation can be determined to be the other binary value (i.e., S3 (F)=S3 (!D)) at 650. For example, if S3 is 11 (where S3 (D)=S3(E)=1), then S3 (F) should be S3 (!D)=0). In some other instances, if the current Hall state S3 includes two different binary values (e.g., 10 or 01), the compensated output signal of the failed Hall sensor F can be determined to alternate between the binary values (e.g., 0 or 1) at 660, for example, at a frequency no less than a maximum state transition frequency of the motor.

Figure 6B:
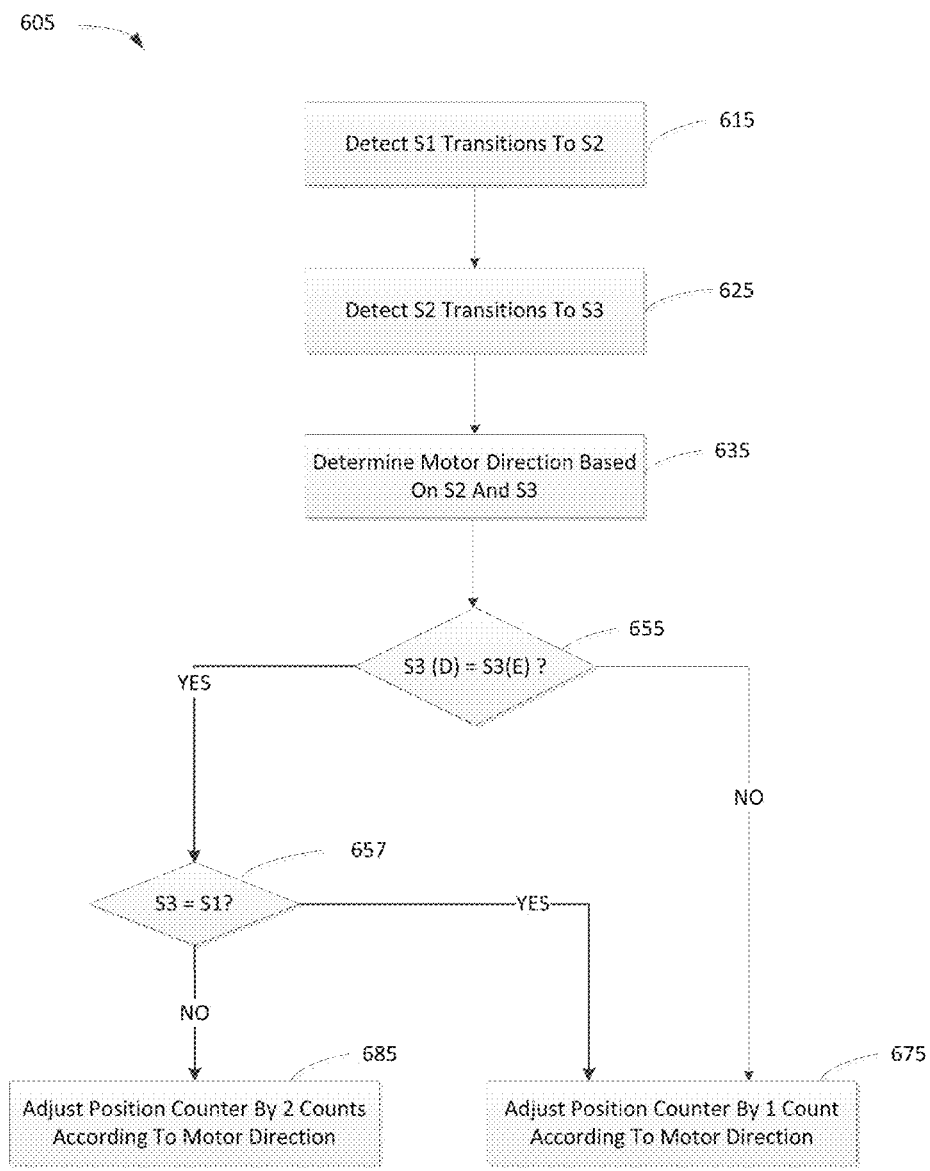

FIG. 6B is a flow chart showing an example process 605 for compensating a position counter of a motor that includes three Hall sensors separated by 120 electrical degrees after a failed Hall sensor is identified (e.g., as described at 610). All or part of the example process 605 may be implemented in hardware, software, firmware, or a combination thereof. In some instances, the example process 605 can be implemented as an example algorithm for the controller 14 for providing position feedback of the motor 10 shown in FIG. 1. The example process 605 can embody the compensation techniques described with respect to Tables 2-4. The process 605, individual operations of the process 605, or groups of operations may be iterated or performed in parallel, in series, or in another manner. In some cases, the process 605 may include the same, additional, fewer, or different operations performed in the same or a different order.

At 615, a first logic state combination (or a first Hall state) S1 transitioning to a second logic state combination (or a second Hall state) S2 can be monitored and detected, as motor moves. The logic state combination can be a combination of the output binary values of two or more Hall sensors. A transition of the logic state combination can be detected based on a change of the output signals of the two or more Hall sensors. Example transitions of the logic state combination are shown in Tables 2-4. As an example, the first logic state combination S1 can be 10 corresponding to two Hall sensors A and B shown in row 1 and row 2 of Table 2, and S1 transitions into the second logic state combination S2 11 in row 3. As another example, the first logic state combination S1 can be 10X corresponding to three Hall sensors A, B, and C shown in row 1 and row 2 of Table 2, and S1 transitions into the second logic state combination S2 11X in row 3, where "X" is the output signal of the failed Hall sensor C and it can be either failed to 0 or 1 for instance.

At 625, the second logic state combination S2 transitioning to a third logic state combination (or a third Hall state) S3 can be monitored and detected. The third logic state combination S3 can be a current state under consideration. The second logic state combination S2 can be the previous state, Pre1, while the first logic state combination S1 can be the state that is two states previous to the current state, Pre2, with respect to the current state S3 as shown in Tables 2-4.

At 635, a rotation direction of the motor can be determined, for example, based on the Hall states S2 and S3. As an example technique, if the valid transition follows a CW state transition sequence (e.g., the example Hall state transition sequence shown in FIG. 1C), the rotation direction can be determined to be CW; otherwise, the rotation direction can be determined to be CCW. Additional or different techniques can be used to determine the rotation direction of the motor.

At 655, if the failed Hall sensor is F, the current Hall sensor output signals of the other two remaining good Hall sensors D and E may need to be checked to determine how to update the position counter for a valid state transition. In some implementations, if the current output signals of the Hall sensor D and E are not the same (i.e., S3 (D) !=S3 (E)), for the state transition under consideration the motor position counter can be updated by one count at 675 according to the rotation direction of the motor determined at 635. As an example implementation, the position counts can be updated as increments if the motor is moving CW, while being updated as decrements when the motor is moving CCW, as determined at 635. In some instances, if the condition that the current state combination S3 (D)=S3 (E) is satisfied, then at 657, the number of counts that the counter will be updated can be determined based on if the previous-2 state combination is the same as the current state combination (i.e., S3=S1?). If S3 and S1 are the same; for a valid state transition the position counter can be updated with one count at 675 based on the motor direction determined at 635; otherwise, the counter can be updated by two counts at 685 accordingly.

Figure 7:
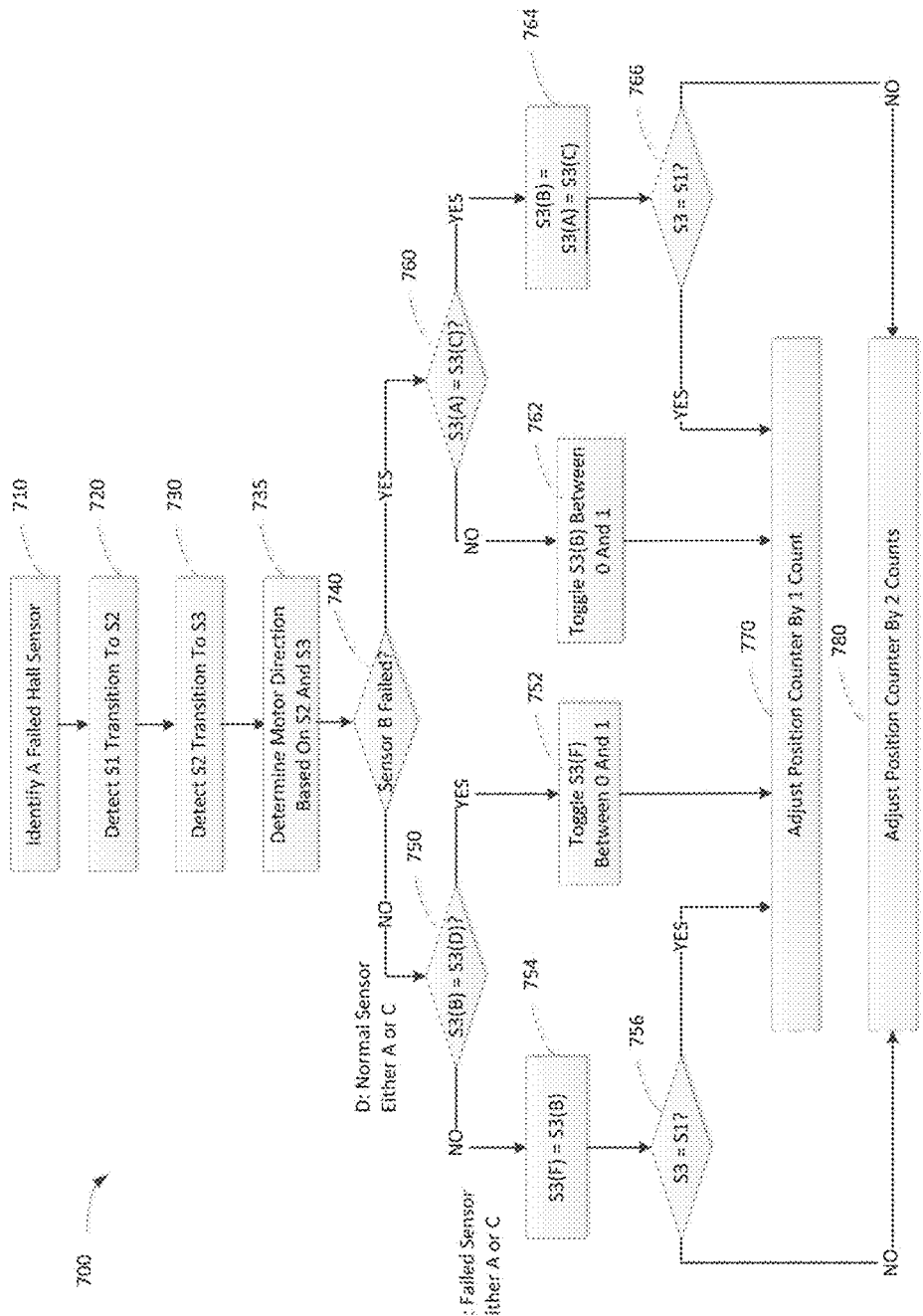
FIG. 7 is a flow chart showing an example process for compensating commutation and a position counter for a motor that includes three Hall sensors separated by 60 electrical degrees.

FIGS. 4-6 and Tables 1-4 include example operations and compensation techniques of a motor with Hall sensors that are separated by 120 electrical degrees. Similar concepts can be used for operations and compensation schemes for a motor with Hall sensors that are separated by 60 electrical degrees, with a few modifications. For example, as shown in FIGS. 1B and 1C, different position configurations of the Hall state sensor can produce different logic state combinations. Unlike the 120° separation arrangement where the fault logic state combinations are 111 and 000, in the 60° separation arrangement, the fault logic state combinations are 010 and 101. In some aspects, unlike the 120° configuration where the three Hall sensors are effectively equivalent, the Hall sensor B that is located in the middle of the three Hall sensors A, B, and C separated by 60° (e.g., the Hall sensors 181, 182, and 183 in FIG. 1B) can play a different role with respect to the other two Hall sensors A and C that are positioned on the two sides. In some implementations, the middle Hall sensor can be referred to as a pivot Hall sensor. In the following, FIG. 7 illustrates an example process for compensating commutation and a position counter of a motor with Hall sensors separated by 60°. Table 5-7 shows example position and commutation compensation techniques when the Hall sensor C, A, and B are failed, respectively. Table 8, in the case that Hall-C is the failed sensor, is an example commutation truth table for a motor with Hall sensors separated by 60°. Commutation truth table for the case that Hall sensor A or B is failed can be obtained in an analogous manner.

FIG. 7 is a flow chart showing an example process 700 for compensating commutation and position counter of a motor that includes three Hall sensors separated by 60 electrical degrees, after a Hall sensor failure is identified. The example process 700 can include the example compensation techniques applied in Tables 5-8. All or part of the example process 700 may be implemented in hardware, software, firmware, or a combination thereof. In some instances, the example process 700 can be implemented as an example algorithm for the controller 14 for controlling the motor commutation and providing position feedback of the motor 10 shown in FIG. 1. The process 700, individual operations of the process 700, or groups of operations may be iterated or performed in parallel, in series, or in another manner. In some cases, the process 700 may include the same, additional, fewer, or different operations performed in the same or different order.

At 710, a failed Hall sensor can be identified. For purposes of the example process 700, it is assumed that the motor includes three Hall sensors A, B, and C, where the Hall sensor B is located in the middle among the three. The three Hall sensors A, B, and C can be digital Hall sensors that are configured to output binary values (e.g., 0 and 1) and the output signals of the Hall sensors can be monitored. In some implementations, the failed Hall sensor can be identified in a similar manner to the example detection techniques described with respect to FIG. 4. For example, the detection can include detecting a first fault logic state combination (e.g., 101 or 010) of the output signals of the three Hall sensors and detecting a second fault logic state combination. The second logic state combination can be the same as the first logic state combination. In some implementations, the second logic state combination can be at least 360 electrical degrees from the first logic state combination. The Hall sensor with an unchanged output signal during the period from the first logic state combination to the second logic state combination can be identified as the failed Hall sensor. Additional or different techniques can be used to detect the failed Hall sensor.

In some instances, as in the 120° Hall sensor separation configuration, the motor may stop moving before the failed Hall sensor is identified. In this case, the example of inducing motor rotation technique described with respect to FIG. 4 can be used for the motor with 60° electrical degree separation configuration as well. For instance, the example technique can include sequentially flipping one of the output signals of the three Hall sensors from one binary value to another binary value. Additional or different techniques can be used to force the motor to move at least until the failed Hall state is identified.

At 720, a first logic state combination (or a first Hall state) S1 transitioning to a second logic state combination (or a second Hall state) S2 can be monitored and detected. The logic state combination can be a combination of the output binary values of the other good Hall sensors. A transition of the logic state combination can be detected based on a change of one of the two output signals of the remaining good Hall sensors. Example transitions of the logic state combination are shown in Tables 5-7. For instance, in Table 5, the Hall sensor C is the identified failed Hall sensor. Then the logic state combination of the two other Hall sensors A and B can be monitored. As an example, Hall state 00 in rows 1 and 2 can be the first logic state combination S1, and the S1 transitions into the second logic state combination S2 01 in row 3. There is no state transition detected from row 1 to row 2 because the output signals of the two Hall sensors A and B remain as 00 and no change of the output signal is detected.

At 730, the second logic state combination S2 transitioning to a third logic state combination (or a third Hall state) S3 can be monitored and detected. Similarly, the third logic state combination S3 can be a current state under consideration. The second logic state combination S2 can be the previous state Pre1, while the first logic state combination S1 can be the state that is two states previous to the current state, Pre2 in Tables 5-7. In the example shown in Table 5, the third logic state combination S3 can be 11 at row 4, with corresponding S2 01 and S1 00 in rows 3 and 2, respectively.

At 735, a rotation direction of the motor can be determined, for example, based on the Hall states S2 and S3. As an example technique, if the valid transition follows a CW state transition sequence (e.g., the example Hall state transition sequence shown in FIG. 1B), the rotation direction can be determined to be CW; otherwise, the rotation direction can be determined to be CCW. Additional or different techniques can be used to determine the rotation direction of the motor.

At 740, a determination of whether the failed Hall sensor is the pivot Hall sensor (e.g., Hall sensor B 182 in FIG. 1B) can be made. If the failed Hall sensor is not the pivot Hall sensor Hall-B, the failed Hall sensor can be the Hall sensor A or C. Tables 5 and 6 show example position and commutation compensation techniques when the non-pivot Hall sensor C or A is failed. At 750, the output signal of the functioning (normal) Hall sensor D is compared with the binary value output of the pivotal Hall sensor (Hall B). The Hall sensor D is either Hall A or C depending on which is the failed Hall sensor F. When the outputs of the Hall sensors B and D are the same, then the compensation for motor commutation is to toggle Hall F output, as indicated by block 752. Otherwise (i.e., S3(B) !=S3 (D)), set the output of Hall F to the binary value as the output of the pivotal Hall sensor B, as indicated by block 754. Then the motor position counter can be updated by one count or two counts at 770 or

780 depending on the outcome of the decision block at 756, where S3 and S1 Hall state combinations are compared (S3=S1?).

As a specific example, operations 750-780 can be described in view of Table 5. For example, given failed Hall sensor C is identified in Table 5, at 750, the output signals of the Hall sensors A and the pivot Hall sensor B at the current Hall state S3 (e.g., 11 at row 4) can be compared. Since the output signals of Hall sensors A and B are the same at S3 11 in row 4, the compensated output signal of the failed Hall sensor C can be determined to alternate between 0 and 1 at 752 for motor commutation, and the position counter is increased by one count as shown in row 4 of Table 5 at 770. In another instance, the current state S3 can be 10 as shown in row 6 of Table 5. The output signals of Hall sensors A and B are now different. Since 101 is a fault logic state combination, the output signal of the failed Hall sensor C should be 0. Accordingly, at 754, the compensated output signal of the failed Hall sensor C can be determined to be 0, the same as the output signal of the pivot Hall sensor B. At 756, the current state S3 is compared with the state that is two states previous to the current state, S1 11 in row 4. Since S3 is different from S1, the position counter is increased by two counts as shown in row 6. Other example applications of operations 750-780 can be found in other rows of Table 5. Similarly, the example operations 750-780 can be applied accordingly when Hall sensor A is the failed and example applications are presented in Table 6.

Referring back to 740, if the pivot Hall sensor B is identified as the failed Hall sensor, the example process 700 can proceed to 760 to determine if the two output signals of the two other Hall sensors A and C are the same or not (i.e., whether S3 (A)=S3 (C)). If the two output signals are different, the compensated output signal of the failed Hall sensor B can be determined to toggle between two binary values (e.g., 0 and 1) at 762, and the position counter can be adjusted by one count at 770. If the two output signals of Hall sensors A and C are the same, the compensated output signal of the failed Hall sensor B can be determined to be the same binary value as the Hall sensor A and C (i.e., S3 (B)=S3 (A)=S3 (C)) at 764. At 766, the current logic state combination S3 can be compared with the previous logic state combination S1(Pre2). If S3 is the same as S1, the position counter can be adjusted by one count at 770; otherwise, the position counter can be adjusted by two counts at 780.

Table 7 shows example position and commutation compensation techniques when the pivot Hall sensor B has failed. For purposes of this example, it is assumed that the current logic state combination S3 of the output signals of the other two Hall sensors A and C is 11 as shown in row 4 of Table 7. According to the example operation 764, the compensated output signal of the failed Hall sensor B should be 1 as well because otherwise 101 would be a fault logic state combination. The current logic state combination S3 11 is not the same as the previous logic state combination S1 00 corresponding to row 1 (there is no detectable state change in row 2), so the position counter can be determined to increase by two counts as shown in row 4. In another instance, assume the current logic state combination S3 of the output signals of the other two Hall sensors A and C is 11 as shown in row 12 of Table 7. Similarly, the compensated output signal of the failed Hall sensor B can be determined to be 1 according to the example operation 764. But the current logic state combination S3 11 is the same as the previous logic state combination S1 (Pre 2), 11, corresponding to row 10 because the motor rotates back one state in a CCW direction in row 11. In this case, the position counter is increased by one count as shown in row 12 of Table 7 according to the example operations 766 and 770.

Table 8 is an example commutation truth table for a motor with Hall sensors separated by 60 electrical degrees. The example commutation truth table can be used to control the commutation of the drive current into the motor. The example commutation truth table shows an example drive scheme or commutation scheme based on the output signals of Hall sensors A and B, and the compensated output signal of the Hall sensor C. In some aspects, commutation truth tables based on the output signals of Hall sensors B and C, and the compensated output signal of the Hall sensor A, or based on the output signals of Hall sensors A and C, and the compensated output signal of the Hall sensor B would be straightforward to a skilled artisan in view of the example commutation truth table shown in Table 8.

Similar to the example commutation truth table shown in Table 1 for a motor with Hall sensors separated by 120 electrical degrees, Table 8 shows an example four-step commutation scheme or drive scheme that includes four distinctive motor commutation steps. Specifically, rows 1 and 2 corresponding to two steps of a standard six-step drive scheme are combined into one step, and rows 4 and 5 are combined into another step. For example, given the output signals of Hall sensors A and B are the same binary value (e.g., 0, the compensated output of the failed Hall sensor C can be determined to alternate between two binary values 0 and 1. Rows 1 and 2 correspond to a first step of the four-step drive scheme where the winding pair C and A can be driven when the logic state combination alternates to 000 and winding pair B and A can be driven when the logic state combination alternates to 001. Similar commutation can be applied to the rows 4 and 5 as a third step of the example drive scheme. A reduced torque can be obtained in the first and third steps. In some other instances, when the output signals of the Hall sensors A and B are different, the compensated output signal of the Hall sensor C can be determined to track the output signal of the pivot Hall sensor (e.g., the Hall sensor B). For example, in a second and a fourth step (e.g., row 3 and 6 in Table 8, respectively), the winding pair B and C can be driven when the logic state combination is 011 and 100, respectively. A full torque can be obtained in the second and fourth steps. The input phase and output phase can be determined based on the rotation direction (e.g., CW or CCW) of the motor as shown in Table 8. In some implementations, the mapping among the commutation of the drive current, the rotation directions, and the logic state combinations can be configured in another manner. Additional or different commutation truth tables can be used for controlling the commutation of the drive current into the motor.

TABLE 8

Example Commutation Table of a Motor with Hall Sensors Separated by 60° when Hall-C is the failed sensor

| Row # | Hall-A | Hall-B | Hall C (Compensated)/ Derived Signal | Motor Current Commutation In CCW Direction | Motor Current Commutation In CW Direction | Torque (TQ) Output |
|---|---|---|---|---|---|---|
| 1 | 0 | 0 | (when alternating to) 0 | Phase_C --> Phase_A | Phase_A ---> Phase_C | Reduced TQ |
| 2 | 0 | 0 | (when alternating to) 1 | Phase_B ---> Phase_A | Phase_A ---> Phase_B | |
| 3 | 0 | 1 | 1 | Phase_B ---> Phase_C | Phase_C ---> Phase_B | Full TQ |
| 4 | 1 | 1 | (when alternating to) 0 | Phase_A ---> Phase_C | Phase_C---> Phase_A | Reduced TQ |
| 5 | 1 | 1 | (when alternating to) 1 | Phase_A ---> Phase_B | Phase_B ---> Phase_A | |
| 6 | 1 | 0 | 0 | Phase_C ---> Phase_B | Phase_B ---> Phase_C | Full TQ |

TABLE 5

Example Position & Commutation Compensations Techniques for a Motor with Hall Sensors separated by 60° (Failed Hall Sensor C)

| Row # | Remarks Failure on Hall-C confirmed | Normal Hall State Sequence Normal Dir | | | Failed Hall C ('0'/'1') State Sequence Current | | | Pre1 ABC | Pre2 ABC | Transition Detection | Transition generated? | Update Commutation State | Update PC | theoretical PC | Actual PC |
|---|---|---|---|---|---|---|---|---|---|---|---|---|---|---|---|
| | | | a | b | c | A | B | C | | | | | | | | |
| 1 | Compensation Applied | 0 | 0 | 0 | 0 | 0 | 0 | 0/1 | 10x | 11x | change detected from Pre1 (A != B) to Current (A = B) | y | Toggle Hall C 0/1 | +1 | 1 | 1 |
| 2 | | 0 | 0 | 0 | 1 | 0 | 0 | 0/1 | | | no change detected | n | Toggle Hall C 0/1 | no change | 2 | |
| 3 | | 0 | 0 | 1 | 1 | 0 | 1 | 0/1 | 00x | 10x | change detected from Pre1 (A = B) to Current (A != B), & Pre2 (AB) != Current (AB) | y | Hall C must be '1' for "010" is a fault | +2 | 3 | 3 |
| 4 | | 0 | 1 | 1 | 1 | 1 | 1 | 0/1 | 01x | 00x | change detected from Pre1 (A != B) to Current (A = B) | y | Toggle Hall C 0/1 | +1 | 4 | 4 |
| 5 | | 0 | 1 | 1 | 0 | 1 | 1 | 0/1 | | | no change detected | n | Toggle Hall C 0/1 | no change | 5 | |
| 6 | | 0 | 1 | 0 | 0 | 1 | 0 | 0/1 | 11x | 01x | change detected, from Pre1 (A = B) to Current (A != B), & Pre2 (AB) != Current (AB) | y | Hall C must be '0' for "101" is a fault | +2 | 6 | 6 |
| 7 | | 0 | 0 | 0 | 0 | 0 | 0 | 0/1 | 10x | 11x | change detected from Pre1 (A != B) to Current (A = B) | y | Toggle Hall C 0/1 | +1 | 7 | 7 |
| 8 | | 0 | 0 | 0 | 1 | 0 | 0 | 0/1 | | | no change detected | n | Toggle Hall C 0/1 | no change | 8 | |
| 9 | | 0 | 0 | 1 | 1 | 0 | 1 | 0/1 | 00x | 10x | change detected, from Pre1 (A = B) to Current (A != B), & Pre2 (AB) != Current (AB) | y | Hall C must be '1' for "010" is a fault | +2 | 9 | 9 |

TABLE 5-continued

Example Position & Commutation Compensations Techniques for a Motor with Hall Sensors separated by 60°
(Failed Hall Sensor C)

| Row # | Remarks Failure on Hall-C confirmed | Normal Hall State Sequence Normal | | | Failed Hall C ('0'/'1') State Sequence Current | | | Pre1 | Pre2 | Transition Detection | Transition generated? | Update Commutation State | Update PC | theoretical PC | Actual PC |
|---|---|---|---|---|---|---|---|---|---|---|---|---|---|---|---|
| | | Dir | a | b | c | A | B | C | ABC | ABC | | | | | |
| 10 | | 0 | 1 | 1 | 1 | 1 | 1 | 0/1 | 01x | 00x | change detected from Pre1 (A != B) to Current (A = B) | y | Toggle Hall C 0/1 | +1 | 10 | 10 |
| 11 | Reverse direction change according direction decoding logics motor moves back one state | 1 | 0 | 1 | 1 | 0 | 1 | 0/1 | 11x | 01x | change detected, from Pre1 (A = B) to Current (A != B), & Pre2 (AB) = Current (AB) | y | Hall C must be '1' for "010" is a fault | −1 | 9 | 9 |
| 12 | | 0 | 1 | 1 | 1 | 1 | 1 | 0/1 | 01x | 11x | change detected from Pre1 (A != B) to Current (A = B) | y | Toggle Hall C 0/1 | +1 | 10 | 10 |
| 13 | | 0 | 1 | 1 | 0 | 1 | 1 | 0/1 | | | no change detected | n | Toggle Hall C 0/1 | no change | 11 | |
| 14 | | 0 | 1 | 0 | 0 | 1 | 0 | 0/1 | 11x | 01x | change detected, from Pre1 (A = B) to Current (A != B), & Pre2 (AB) != Current (AB) | y | Hall C must be '0' for "101" is a fault | +2 | 12 | 12 |

TABLE 6

Example Position & Commutation Compensations Techniques for Motor with Hall Sensors Separated by 60°
(Failed Hall Sensor A)

| Row # | Remarks Failure on Hall-A confirmed | Normal Hall State Sequence Normal | | | Failed Hall A ('0'/'1') State Sequence Current | | | Pre1 | Pre2 | Transition Detection | Transition generated? | Update Com- mutation State | Update PC | Theoretical PC | Actual PC |
|---|---|---|---|---|---|---|---|---|---|---|---|---|---|---|---|
| | | Dir | a | b | c | A | B | C | ABC | ABC | | | | | |
| 1 | Compensation Applied | 0 | 0 | 0 | 0 | 0/1 | 0 | 0 | | | no change detected | y | Toggle Hall A 0/1 | no change | 1 | 0 |
| 2 | | 0 | 0 | 0 | 1 | 0/1 | 0 | 1 | x00 | x00 | change detected, from Pre1 (B = C) to Current (B != C), & Pre2 (BC) != Current (BC) | y | Hall A must be '0' for "101" is a fault | +2 | 2 | 2 |
| 3 | | 0 | 0 | 1 | 1 | 0/1 | 1 | 1 | x01 | x00 | change detected, from Pre1 | y | Toggle Hall A 0/1 | +1 | 3 | 3 |

TABLE 6-continued

Example Position & Commutation Compensations Techniques for Motor with Hall Sensors Separated by 60°
(Failed Hall Sensor A)

| Row # | Remarks Failure on Hall-A confirmed | Dir | Normal Hall State Sequence Normal a | | b | c | Failed Hall A ('0'/'1') State Sequence Current A | | B | C | Pre1 ABC | Pre2 ABC | Transition Detection | Transition generated? | Update Commutation State | Update PC | Theoretical PC | Actual PC |
|---|---|---|---|---|---|---|---|---|---|---|---|---|---|---|---|---|---|
| 4 | | 0 | 1 | 1 | 1 | 0/1 | 1 | 1 | | | (B != C) to Current (B = C) no change detected | n | Toggle Hall A 0/1 | no change | 4 | |
| 5 | | 0 | 1 | 1 | 0 | 0/1 | 1 | 0 | x11 | x11 | change detected, from Pre1 (B = C) to Current (B != C), & Pre2 (BC) != Current (BC) | y | Hall A must be '1' for "010" is a fault | +2 | 5 | 5 |
| 6 | | 0 | 1 | 0 | 0 | 0/1 | 0 | 0 | x10 | x11 | change detected, from Pre1 (B != C) to Current (B = C) | y | Toggle Hall A 0/1 | +1 | 6 | 6 |
| 7 | | 0 | 0 | 0 | 0 | 0/1 | 0 | 0 | | | no change detected | n | Toggle Hall A 0/1 | no change | 7 | |
| 8 | | 0 | 0 | 0 | 1 | 0/1 | 0 | 1 | x00 | x10 | change detected, from Pre1 (B = C) to Current (B != C), & Pre2 (BC) != Current (BC) | y | Hall A must be '0' for "101" is a fault | +2 | 8 | 8 |
| 9 | | 0 | 0 | 1 | 1 | 0/1 | 1 | 1 | x01 | x00 | change detected, from Pre1 (B != C) to Current (B = C) | y | Toggle Hall A 0/1 | +1 | 9 | 9 |
| 10 | | 0 | 1 | 1 | 1 | 0/1 | 1 | 1 | | | no change detected | n | Toggle Hall A 0/1 | no change | 10 | 9 |
| 11 | direction change motor moves back one state | 1 | 0 | 1 | 1 | 0/1 | 1 | 1 | | | no change detected | n | Toggle Hall A 0/1 | no change | 10 | 9 |
| 12 | | 0 | 1 | 1 | 1 | 0/1 | 1 | 1 | | | no change detected | n | Toggle Hall A 0/1 | no change | 10 | 9 |
| 13 | | 0 | 1 | 1 | 0 | 0/1 | 1 | 0 | x11 | x11 | change detected, from Pre1 (B = C) to Current (B != C), & Pre2 | y | Hall A must be '1' for "010" is a fault | +2 | 11 | 11 |

TABLE 6-continued

Example Position & Commutation Compensations Techniques for Motor with Hall Sensors Separated by 60°
(Failed Hall Sensor A)

| Row # | Remarks Failure on Hall-A confirmed | Dir | Normal Hall State Sequence Normal | | | Failed Hall A ('0'/'1') State Sequence Current | | | Pre1 ABC | Pre2 ABC | Transition Detection | Transition generated? | Update Commutation State | Update PC | Theoretical PC | Actual PC |
|---|---|---|---|---|---|---|---|---|---|---|---|---|---|---|---|---|
| | | | a | b | c | A | B | C | | | | | | | | |
| 14 | | 0 | 1 | 0 | 0 | 0/1 | 0 | 0 | x10 | x11 | (BC) != Current (BC) change detected, from Pre1 (B != C) to Current (B = C) | y | Toggle Hall A 0/1 | +1 | 12 | 12 |
| 15 | direction change motor moves back one state | 1 | 1 | 1 | 0 | 0/1 | 1 | 0 | x00 | x10 | change detected, from Pre1 (B = C) to Current (B = C), & Pre2 (BC) = Current (BC) | y | Hall A must be '1' for "010" is a fault | −1 | 11 | 11 |
| 16 | | 0 | 1 | 0 | 0 | 0/1 | 0 | 0 | x10 | x00 | change detected, from Pre1 (B != C) to Current (B = C) | y | Toggle Hall A 0/1 | +1 | 12 | 12 |

TABLE 7

Example Position & Commutation Compensations Techniques for a Motor with Hall Sensors Separated by 60°
(Failed Hall Sensor B)

| Row # | Remarks | Dir | Normal Hall State Sequence Normal | | | Failed Hall B ('0'/'1') State Sequence Current | | | Pre1 ABC | Pre2 ABC | Transition Detection | Transition generated? | Update Commutation State | Update PC | theoretical PC | Actual PC |
|---|---|---|---|---|---|---|---|---|---|---|---|---|---|---|---|---|
| | | | a | b | c | A | B | C | | | | | | | | |
| 1 | Failure on Hall-B confirmed | 0 | 0 | 0 | 0 | 0 | 0/1 | 0 | | | | | | | | |
| 2 | Compensation Applied | 0 | 0 | 0 | 1 | 0 | 0/1 | 1 | 0x0 | 1x0 | Change detected, from Pre1 (A = C) to Current (A != C) 1 cnt change only | Y | A != C Toggle Hall B 0/1 | +1 | 1 | 1 |
| 3 | | 0 | 0 | 1 | 1 | 0 | 0/1 | 1 | | | no change detected | n | A != C Toggle Hall B 0/1 | no change | 2 | |
| 4 | | 0 | 1 | 1 | 1 | 1 | 0/1 | 1 | 0x1 | 0x0 | change detected, from Pre1 (A != C) to Current (A = C), & Pre2 (AC) != Current (AC) | y | Hall B must be '1' for "101" is a fault | +2 | 3 | 3 |

TABLE 7-continued

Example Position & Commutation Compensations Techniques for a Motor with Hall Sensors Separated by 60°
(Failed Hall Sensor B)

| Row # | Remarks | Normal Hall State Sequence Normal | | | | Failed Hall B ('0'/'1') State Sequence Current | | | Pre1 | Pre2 | Transition Detection | Transition generated? | Update Commutation State | Update PC | theoretical PC | Actual PC |
|---|---|---|---|---|---|---|---|---|---|---|---|---|---|---|---|---|
| | | Dir | a | b | c | A | B | C | ABC | ABC | | | | | | |
| 5 | | 0 | 1 | 1 | 0 | 1 | 0/1 | 0 | 1x1 | 0x1 | from Pre1 (A = C) to Current (A != C) 1 cnt change only | y | A != C Toggle Hall B 0/1 | +1 | 4 | 4 |
| 6 | | 0 | 1 | 0 | 0 | 1 | 0/1 | 0 | | | no change detected | n | A != C Toggle Hall B 0/1 | no change | 5 | |
| 7 | | 0 | 0 | 0 | 0 | 0 | 0/1 | 0 | 1x0 | 1x1 | Change detected from Pre1 (A != C) to Current (A = C), & Pre2 (AC) != Current (AC) | y | Hall B must be '0' for "010" is a fault | +2 | 6 | 6 |
| 8 | | 0 | 0 | 0 | 1 | 0 | 0/1 | 1 | 0x0 | 1x0 | from Pre1 (A = C) to Current (A != C) 1 cnt change only | y | A != C Toggle Hall B 0/1 | +1 | 7 | 7 |
| 9 | | 0 | 0 | 1 | 1 | 0 | 0/1 | 1 | | | no change detected | n | A != C Toggle Hall B 0/1 | no change | 8 | |
| 10 | | 0 | 1 | 1 | 1 | 1 | 0/1 | 1 | 0x1 | 0x0 | Change detected from Pre1 (A != C) to Current (A = C), & Pre2 (AC) != Current (AC) | y | Hall B must be '1' for "101" is a fault | +2 | 9 | 9 |
| 11 | direction change motor moves back one state | 1 | 0 | 1 | 1 | 0 | 0/1 | 1 | 1x1 | 0x1 | from Pre1 (A = C) to Current (A != C) 1 cnt change only | y | A != C Toggle Hall B 0/1 | −1 | 8 | 8 |
| 12 | | 0 | 1 | 1 | 1 | 1 | 0/1 | 1 | 0x1 | 1x1 | Change detected from Pre1 (A != C) to Current (A = C), & Pre2 (AC) = Current (AC) | y | Hall B must be '1' for "101" is a fault | +1 | 9 | 9 |
| 13 | | 0 | 1 | 1 | 0 | 1 | 0/1 | 0 | 1x1 | 0x1 | from Pre1 (A = C) to Current (A != C) 1 cnt change only | y | A != C Toggle Hall B 0/1 | +1 | 10 | 10 |
| 14 | | 0 | 1 | 0 | 0 | 1 | 0/1 | 0 | | | no change detected | n | A != C Toggle Hall B 0/1 | no change | 11 | 10 |
| 15 | direction change motor moves back one state | 1 | 1 | 1 | 0 | 1 | 0/1 | 0 | | | no change detected | n | A != C Toggle Hall B 0/1 | no change | | 10 |
| 16 | | 0 | 1 | 0 | 0 | 1 | 0/1 | 0 | | | no change detected | n | A != C Toggle Hall B 0/1 | no change | | 11 |
| 17 | | 0 | 0 | 0 | 0 | 0 | 0/1 | 0 | 1x0 | 1x1 | Change detected from Pre1 (A != C) to Current (A = C), & Pre2 (AC) != Current (AC) | y | Hall B must be '0' for "010" is a fault | +2 | 12 | 12 |

Using the compensation schemes described with respect to FIGS. 4-7 and Tables 1-8 for a motor with a failed Hall sensor out of three or more Hall sensors, an example motor system that uses only two Hall sensors may be designed. The example motor system with two Hall sensors can operate in a similar manner as the typical motor with three or more Hall sensors with a full or reduced torque. The two Hall sensors can be placed 120 or 60 electrical degrees to each other, or they can be configured in another manner. Based on the output signals of the two Hall sensors, a third signal can be generated for the two-Hall-sensor motor. In some implementations, the third signal can mimic the compensated output signals of a failed Hall sensor of a three-Hall-sensor motor as described with respect to FIGS. 4-7 and Tables 1-8. The commutation of the example two-Hall-sensor motor can be controlled based on the output signals of the two Hall sensors and the generated third signal, for example, according to the example commutation truth table in Tables 1 and 8, or in another manner. The position counter of the two-Hall-sensor motor can be updated, for example, according to the example position counter compensation techniques described with respect to FIGS. 6 and 7, and Tables 2-7, or based on another scheme.

Figure 8:
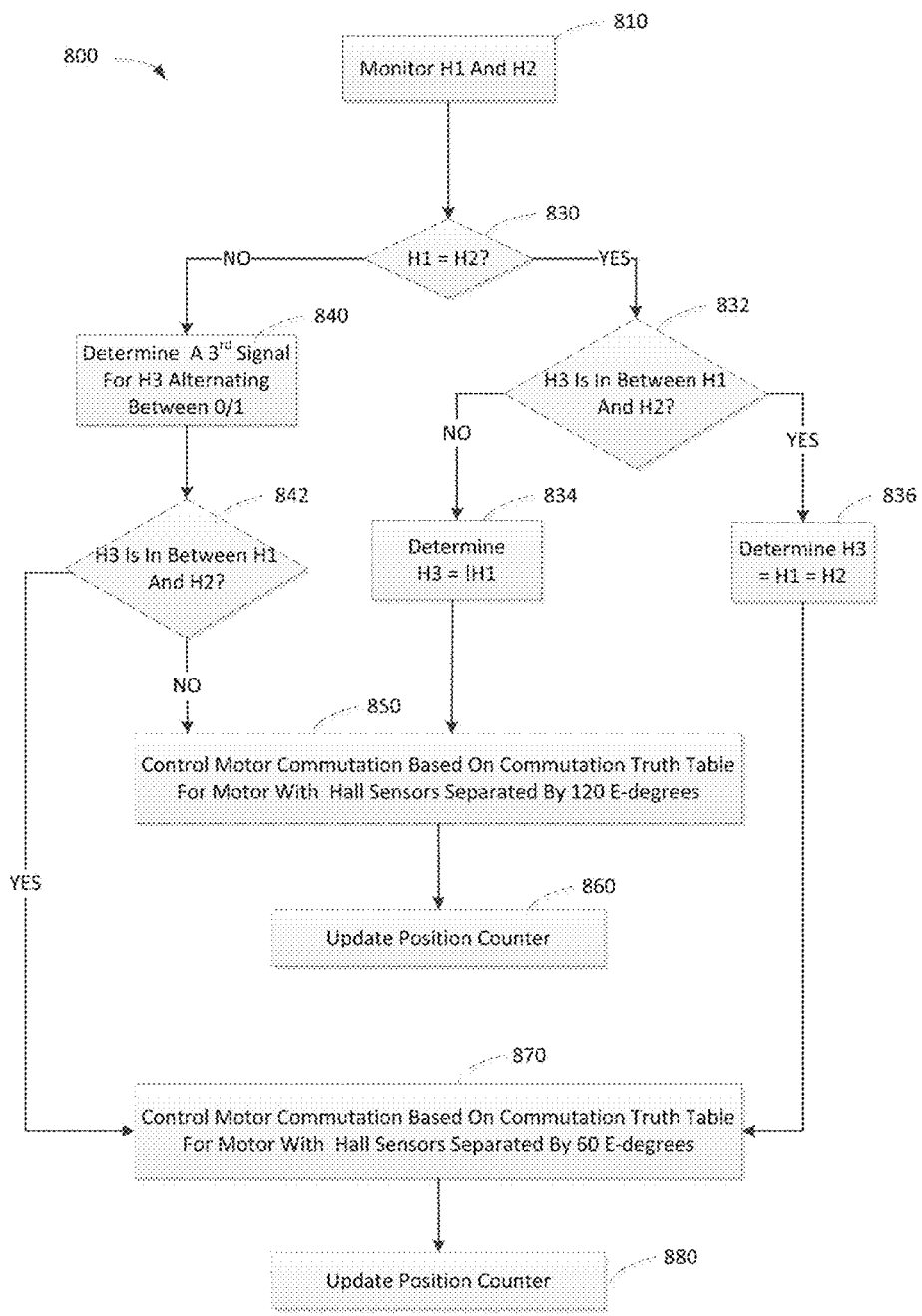
FIG. 8 is a flow chart showing an example process for controlling a motor that includes two or more Hall sensors separated by 120 electrical degrees.

FIG. 8 is a flow chart that shows the example process 800 for controlling a motor that includes two or more Hall sensors separated by 120 electrical degrees. All or part of the example process 800 may be implemented in hardware, software, firmware, or a combination thereof. In some instances, the example process 800 can be performed by a motor controller (e.g., the controller 14 of the motor 10 shown in FIG. 1) that is configured to control the motor. The process 800, individual operations of the process 800, or groups of operations may be iterated or performed in parallel, in series, or in another manner. In some cases, the process 800 may include the same, additional, fewer, or different operations performed in the same or a different order.

At 810, output signals of the two Hall sensors H1 and H2 are monitored. The two Hall sensors H1 and H2 each can be configured to output binary values. The two Hall sensors H1 and H2 can be the only two Hall sensors that the motor has, or they can be two out of three or more Hall sensors of the motor. For example, the two Hall sensors H1 and H2 can be any two of the three Hall sensors A 184, B 185, and C 186 of a motor with 120° separation configuration in FIG. 1C, or the two Hall sensors can be Hall sensor A 181 and Hall sensor C 183 of a motor with 60° separation configuration in FIG. 1B. The two Hall sensors H1 and H2 can be separated by 120 in another manner.

A third signal can be determined based on the output signals of Hall sensors H1 and H2. The third signal can be an output signal of a third Hall sensor H3. In some instances, the third Hall sensor H3 can be an actual Hall sensor of the motor. As one example, the third Hall sensor H3 can be one of the three Hall sensors A 184, B 185, and C 186 in FIG. 1C given the Hall sensors H1 and H2 are the other two. In this case, the three Hall sensors H1, H2 and H3 can form a 120 separation configuration. As another example, the third Hall sensor H3 can be the middle Hall sensor B 182 as shown in FIG. 1B between the two Hall sensors H1 and H2 that correspond to Hall sensor A 181 and Hall sensor C 183, respectively. In this case, the three Hall sensors H1, H2, and H3 can form a 60° separation configuration. In some instances, the third Hall sensor can be a failed Hall sensor of the motor and the third signal can be a compensated output signal for the failed Hall sensor. In this case, determining the third signal can include using the third signal as a compensated output signal of the third Hall sensor of the motor. In some other implementations, for a motor with only two Hall sensors H1 and H2, the third signal can mimic an output signal of a "hypothetical" third Hall sensor. In this case, determining the third signal include generating the third signal for the hypothetical Hall sensor H3 based on the output signal of the two Hall sensors H1 and H2. In the following, both the "hypothetical" third Hall sensor for a two-Hall-sensor motor, and the actual Hall sensor of a motor including three or more Hall sensors are referred to as the third Hall sensor H3.

At 830, the output signals of the two Hall sensors H1 and H2 are compared. When the output signals of the two Hall sensors are different binary values, at 840, the third signal can be determined to alternate between the binary values (e.g., 0 and 1), for example, at a frequency no less than a maximum state transition frequency of the motor. At 842, the relative position of the three Hall sensors H1-H3 can be determined. If the Hall sensor H3 is located in between the other two Hall sensors H1 and H2 and is separated from each of H1 and H2 by 60° cat 870, commutation of the drive current into the motor can be controlled based on the third signal and the outputs of the third signal and two Hall sensors H1 and H2 according to a commutation truth table (e.g., Table 8) for a motor with Hall sensors separated by 60 electrical degrees. At 880, the position counter of the motor can be updated based on the third signal and the outputs of the two Hall sensors H1 and H2, for example, according to the example techniques described with respect to Tables 5-7 for a motor with Hall sensors separated by 60 electrical degrees. On the other hand, if the Hall sensor H3 is not located between the other two Hall sensors H1 and H2, but instead is separated from each of hall sensors H1 and H2 by 120 electrical degrees, at 850, the commutation of the drive current into the motor can be controlled based on the third signal and the outputs of the two Hall sensors H1 and H2 according to a commutation truth table (e.g., Table 1) for a motor with Hall sensors separated by 120 electrical degrees. At 860, the position counter of the motor can be updated based on the outputs of the two Hall sensors H1 and H2, for example, according to the example techniques described with respect to Tables 2-4 for a motor with Hall sensors separated by 120 electrical degrees. In some implementations, the position counter may be updated in another manner.

Referring back to 830, when the output signals of the two Hall sensors are the same binary values, the relative position of the three Hall sensors H1-H3 can be determined at 832. If the Hall sensor H3 is located in between of the other two Hall sensors H1 and H2 and is separated from each of H1 and H2 by 60 electrical degrees, the third signal can be determined to the same binary value as the output signals of H1 and H2. The example process 800 can proceed to 870 to control the motor commutation based on the third signal and the outputs of the two Hall sensors H1 and H2 according to a commutation truth table (e.g., Table 8) for a motor with Hall sensors separated by 60 electrical degrees. At 880, the position counter of the motor can be updated based on the outputs of the two Hall sensors H1 and H2, for example, according to the example techniques described with respect to Tables 5-7 for a motor with Hall sensors separated by 60 electrical degrees or in another manner.

On the other hand, if the Hall sensor H3 is not located in between of the other two Hall sensors H1 and H2, but instead is separated from each of sensors H1 and H2 by 120 electrical degrees, at 834, the third signal can be determined to be the binary value other than the same binary value output of H1 and H2. The example process may then proceed to 850 to control the motor commutation based on the third signal and the outputs of the two Hall sensors H1 and H2 according to a commutation truth table (e.g., Table 1) for a motor with Hall sensors separated by 120 electrical degrees. At 860, the position counter of the motor can be updated based on the outputs of the two Hall sensors H1 and H2, for example, according to the example techniques described with respect to Tables 2-4 for a motor with Hall sensors separated by 120 electrical degrees. In some implementations, the position counter may be updated in another manner.

Figure 9:
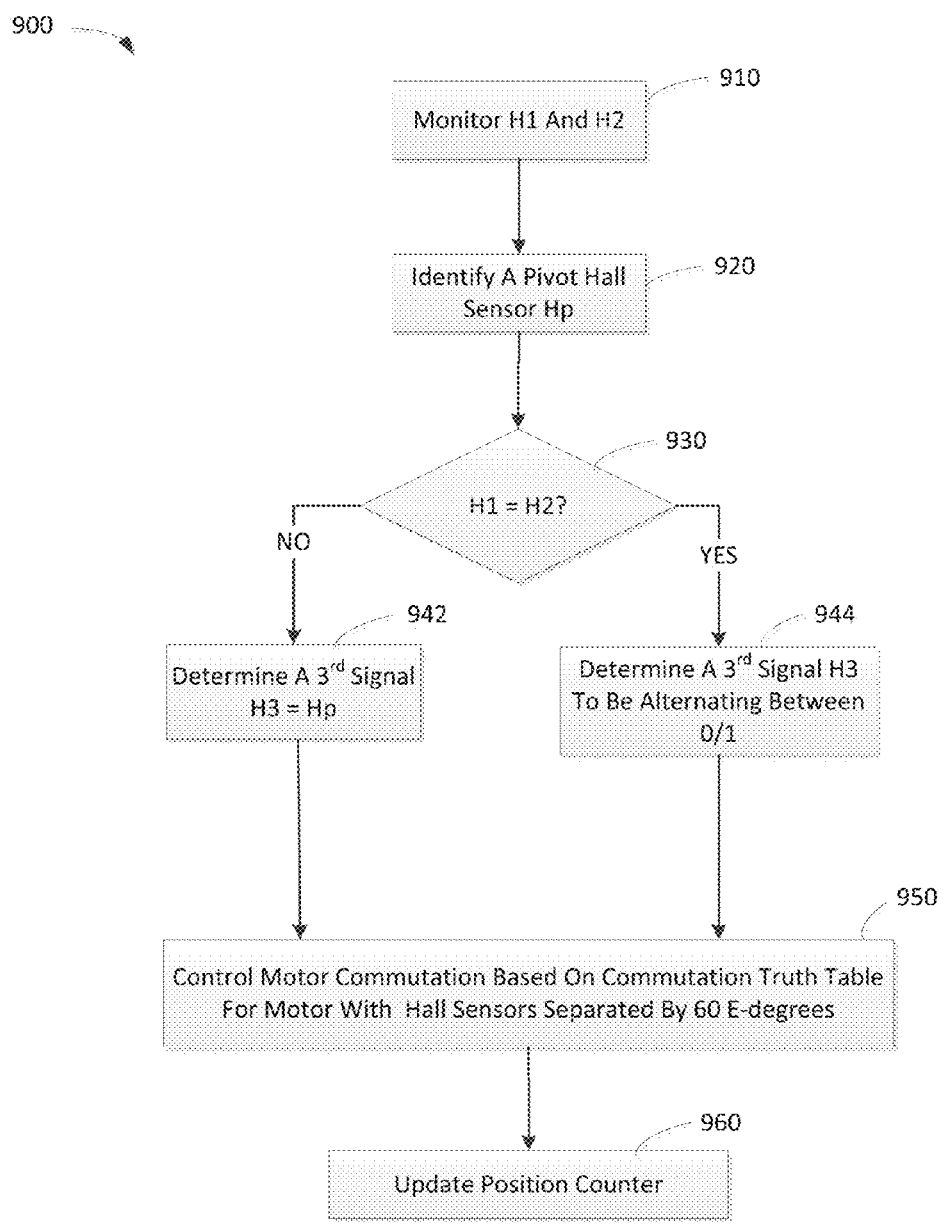
FIG. 9 is a flow chart showing an example process for controlling a motor that includes two or more Hall sensors separated by 60 electrical degrees.

FIG. 9 is a flow chart showing the example process 900 for controlling a motor that includes two or more Hall sensors separated by 60 electrical degrees. All or part of the example process 900 may be implemented in hardware, software, firmware, or a combination thereof. In some instances, the example process 900 can be performed by a motor controller (e.g., the controller 14 of the motor 10 shown in FIG. 1) that is configured to control the motor. The process 900, individual operations of the process 900, or groups of operations may be iterated or performed in parallel, in series, or in another manner. In some cases, the process 900 may include the same, additional, fewer, or different operations performed in the same or a different order.

At 910, output signals of the two Hall sensors H1 and H2 are monitored. The two Hall sensors H1 and H2 each can be configured to output binary values. The two Hall sensors H1 and H2 can be the only two Hall sensors that the motor has, or they can be two out of three or more Hall sensors of the motor. For instance, the two Hall sensors H1 and H2 can be the Hall sensors A 181 and B 182, or B 182 and C 183 that are separated by 60° as shown in FIG. 1B. The two Hall sensors H1 and H2 can be separated by 60° in another manner.

At 920, a pivot Hall sensor Hp can be identified. The pivot Hall sensor Hp can be identified, for example, by selecting one from the two Hall sensors H1 and H2, or in another manner. The pivot Hall sensor Hp can be the middle Hall sensor (e.g., the Hall sensor B 182 in FIG. 1B) among three Hall sensors in a 60° separation configuration.

Similar to the example process 800, a third signal for a third Hall sensor H3 can be determined based on the output signals of Hall sensors H1 and H2. The third Hall sensor can be a hypothetical Hall sensor for the motor with only two Hall sensors, or an actual Hall sensor of a motor with three or more Hall sensors. In some instances, for a two-Hall-sensor motor, determining the third signal can include generating the third signal for the hypothetical Hall sensor H3. In some other instances, the third Hall sensor can be a failed Hall sensor of the motor that includes three or more Hall sensor. The third signal can be a compensated output signal for the failed Hall sensor. In this case, determining the third signal can include using the third signal as a compensated output signal of the third Hall sensor of the motor. In some implementations, the third Hall sensor H3 is located 60° apart from the pivot Hall sensor Hp. The third Hall sensor H3 may be configured in another manner relative to the other two Hall sensors H1 and H2.

At 930, the output signals of the two Hall sensors H1 and H2 are compared. When the output signals of the two Hall sensors are different binary values, the third signal can be determined to be the same as the output signal of the pivot Hall sensor Hp at 942. On the other hand, when the output signals of the two Hall sensors are the same binary values, at 944, the third signal can be determined to be alternating between the binary values, for example, at a frequency no less than a maximum state transition frequency of the motor.

At 950, commutation of the drive current into the motor can be controlled based on the third signal and the outputs of the two Hall sensors H1 and H2, for example, according to a commutation truth table (e.g., Table 8) for a motor with Hall sensors separated by 60 electrical degrees. The motor commutation can be controlled based on the example techniques described with respect to Table 8 as well, or in another manner.

At 960, the position counter of the motor can be updated based on the outputs of the two Hall sensors H1 and H2, for example, according to the example techniques described with respect to Tables 5-7 for a motor with Hall sensors separated by 60 electrical degrees. In some implementations, the position counter may be updated in another manner.

A number of examples have been shown and described; various modifications can be made. While this specification contains many details, these should not be construed as limitations on the scope of what may be claimed, but rather as descriptions of features specific to particular examples. Certain features that are described in this specification in the context of separate implementations can also be combined. Conversely, various features that are described in the context of a single implementation can also be implemented separately or in any suitable sub-combination. Accordingly, other implementations are within the scope of the following claims.

The invention claimed is:

1. A motor system comprising:
a motor comprising two Hall sensors configured to output binary values, the two Hall sensors being placed 120 electrical degrees apart; and
a controller configured to control the motor, the controller being operable to:
monitor output signals of the two Hall sensors;
in response to determining that a first Hall sensor of the two Hall sensors outputs a first binary value while a second Hall sensor of the two Hall sensors outputs a second binary value that is different from the first binary value, determine a third signal to be alternating from the first binary value to the second binary value, and then from the second binary value to the first binary value at a frequency no less than a maximum state transition frequency of the motor, wherein the maximum state transition frequency of the motor is a maximum number of logic state transitions per a time unit of the motor given a maximum operating speed of the motor; and
control commutation of a drive current into the motor based on the third signal and the outputs of the two Hall sensors, wherein controlling commutation of a drive current into the motor based on the third signal and the outputs of the two Hall sensors comprises:
in response to determining that the first Hall sensor of the two Hall sensors outputs the first binary value while the second Hall sensor of the two Hall sensors outputs the first binary value,
determining the third signal to be the second binary value other than the first binary value; and
controlling the commutation of the drive current into the motor based on the third signal and the outputs of the two Hall sensors according to a commutation truth table for a motor with Hall sensors separated by 120 electrical degrees; or in response to determining that the first Hall sensor of the two Hall sensors outputs the first binary value while the second Hall sensor of the two Hall sensors outputs the first binary value,
determining the third signal to be the first binary value; and
controlling the commutation of the drive current into the motor based on the third signal and the outputs of the two Hall sensors according to a commutation truth table of a motor with Hall sensors separated by 60 electrical degrees.

2. The motor system of claim 1, wherein determining the third signal comprises generating the third signal.

3. The motor system of claim 1, wherein the controller is operable to update a motor position counter based on a logic state combination of the output signals of the two Hall sensors.

4. The motor system of claim 3, wherein the controller is operable to update the motor position counter based on the logic state combination of the output signals of the two Hall sensors by steps comprising:
monitoring a first logic state combination transitioning to a second logic state combination;
monitoring the second logic state combination transitioning to a third logic state combination;
when the third logic state combination comprises two same binary values;
comparing the third logic state combination with the first logic state combination;
if the third logic state combination is the same as the first logic state combination, updating the motor position counter by one count; and
if the third logic state combination is not the same as the first logic state combination, updating the motor position counter by two counts.

5. The motor system of claim 4, wherein the controller is operable to update the motor position counter based on the logic state combination of the output signals of the two Hall sensors by the steps comprising:
when the third logic state combination comprises two different binary values, updating the motor position counter by one count.

6. The motor system of claim 4, wherein the controller is operable to update the motor position counter based on the logic state combination of the output signals of the two Hall sensors by the steps comprising decoding a moving direction of the motor based on the third logic state combination and the second logic state combination.

7. The motor system of claim 1, wherein the motor comprises a third Hall sensor configured to output binary values and the controller is operable to monitor an output signal of the third Hall sensor.

8. The motor system of claim 7, wherein the controller is further operable to force the motor to move by sequentially flipping one of the output signals of the two Hall sensors and the third Hall sensor from one binary value to another binary value.

9. The motor system of claim 7, wherein the controller is operable to determine the third signal by using the third signal as a compensated output signal of the third Hall sensor.

10. The motor system of claim 7, wherein the controller is further operable to identify the third Hall sensor as a failed Hall sensor based on a logic state combination of the output signals of the two Hall sensors and the output signal of the third Hall sensor.

11. The motor system of claim 10, wherein the controller is operable to identify the third Hall sensor as the failed Hall sensor by steps comprising:
detecting a first fault logic state combination of the output signals of the two Hall sensors and the output signal of the third Hall sensor;
detecting a second fault logic state combination of the output signals of the two Hall sensors and the output signal of the third Hall sensor; and
identifying that the output signal of the third Hall sensor remains unchanged during a period from the first fault logic state combination to the second fault logic state combination.

12. The motor system of claim 11, wherein the second fault logic state combination is at least 360 electrical degrees from the first fault logic state combination.

13. The motor system of claim 11, wherein the third Hall sensor is 120 electrical degrees apart from either of the two Hall sensors, and the first fault logic state combination comprises a combination of three same binary values, and the second fault logic state combination is the same as the first fault logic state combination.

14. The motor system of claim 11, wherein the third Hall sensor is 60 electrical degrees apart from each of the two Hall sensors, and the first fault logic state combination comprises a combination where the first Hall sensor of the two Hall sensors outputs the first binary value while the second Hall sensor of the two Hall sensors outputs the first binary value, and the output signal of the third Hall sensor has the second binary value, and the second fault logic state combination is the same as the first fault logic state combination.

* * * * *